(12) United States Patent
Ito et al.

(10) Patent No.: US 9,768,010 B2
(45) Date of Patent: Sep. 19, 2017

(54) LIQUID TREATMENT APPARATUS

(75) Inventors: Norihiro Ito, Koshi (JP); Kazuhiro Aiura, Koshi (JP); Naoki Shindo, Koshi (JP); Yosuke Hachiya, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 909 days.

(21) Appl. No.: 13/823,205

(22) PCT Filed: Aug. 1, 2012

(86) PCT No.: PCT/JP2012/069551
§ 371 (c)(1),
(2), (4) Date: Mar. 14, 2013

(87) PCT Pub. No.: WO2013/021883
PCT Pub. Date: Feb. 14, 2013

(65) Prior Publication Data
US 2013/0180659 A1    Jul. 18, 2013

(30) Foreign Application Priority Data
Aug. 5, 2011    (JP) .................................. 2011-172158

(51) Int. Cl.
*H01L 21/02*    (2006.01)
*H01L 21/465*    (2006.01)
(Continued)

(52) U.S. Cl.
CPC ...... *H01L 21/02041* (2013.01); *H01L 21/465* (2013.01); *H01L 21/6719* (2013.01);
(Continued)

(58) Field of Classification Search
USPC .......................... 156/345.21, 345.55; 134/198
See application file for complete search history.

(56) References Cited

U.S. PATENT DOCUMENTS 5,927,303 A * 7/1999 Miya .................... B08B 3/00
134/148
2003/0172955 A1    9/2003 Kuroda et al.
(Continued)

FOREIGN PATENT DOCUMENTS

| JP | 10-209102 A1 | 8/1998 |
| JP | 2000-077378 A1 | 3/2000 |

(Continued)

OTHER PUBLICATIONS

Japanese Office Action (Application No. 2014-041489) dated Apr. 17, 2015.
International Search Report dated Sep. 11, 2012.

*Primary Examiner* — Sylvia R MacArthur
(74) *Attorney, Agent, or Firm* — Burr & Brown, PLLC

(57) ABSTRACT

A liquid treatment apparatus includes a substrate holder (21) that holds a substrate horizontally and rotates the substrate, a treatment liquid nozzle (82) that supplies a treatment liquid to the substrate held by the substrate holder, a cup (40) that is arranged outside of a peripheral edge of the substrate held by the substrate holder and receives the treatment liquid which has been supplied to the substrate by the treatment liquid nozzle, a top plate (32) that covers the substrate held by the substrate holder from above, a top plate rotation driving mechanism that rotates the top plate, and a liquid receiving member (130) that surrounds a peripheral edge of the top plate and has a circular liquid receiving space (132).

13 Claims, 13 Drawing Sheets

(51) Int. Cl.
  *H01L 21/67*  (2006.01)
  *H01L 21/687*  (2006.01)
(52) U.S. Cl.
  CPC .. *H01L 21/67051* (2013.01); *H01L 21/68785* (2013.01); *H01L 21/68792* (2013.01)

(56) References Cited

U.S. PATENT DOCUMENTS

| | | | | |
|---|---|---|---|---|
| 2003/0226577 | A1* | 12/2003 | Orll | H01L 21/67051 134/1.3 |
| 2005/0276921 | A1* | 12/2005 | Miya | B08B 3/02 427/240 |
| 2012/0312336 | A1* | 12/2012 | Itoh | H01L 21/67051 134/36 |
| 2013/0014784 | A1* | 1/2013 | Ito | G03F 7/423 134/10 |

FOREIGN PATENT DOCUMENTS

| | | |
|---|---|---|
| JP | 2003-282514 A1 | 10/2003 |
| JP | 2005-142290 A1 | 6/2005 |
| JP | 2007-035866 A1 | 2/2007 |
| JP | 2009-218404 A1 | 9/2009 |
| JP | 2009-267101 A1 | 11/2009 |

* cited by examiner

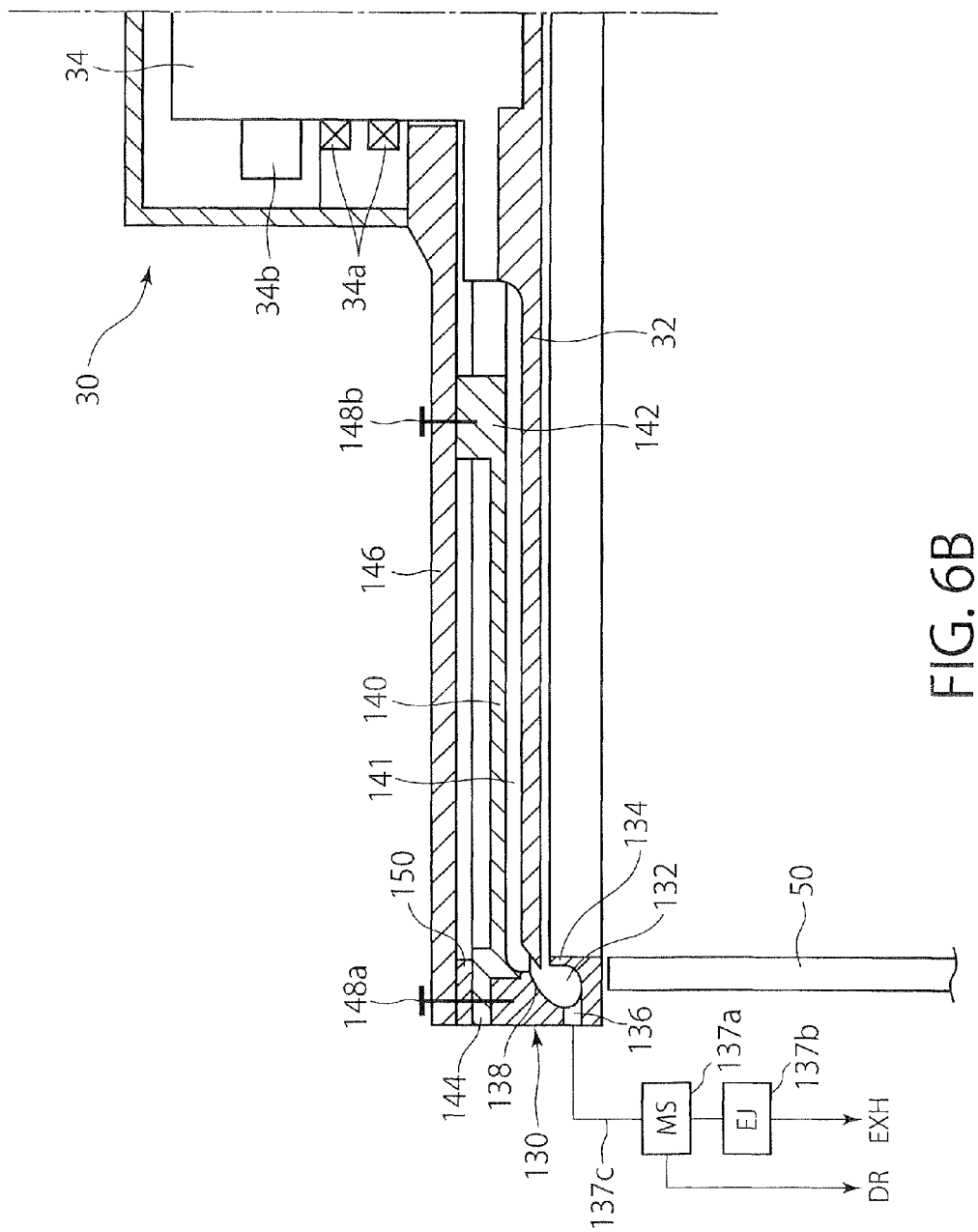

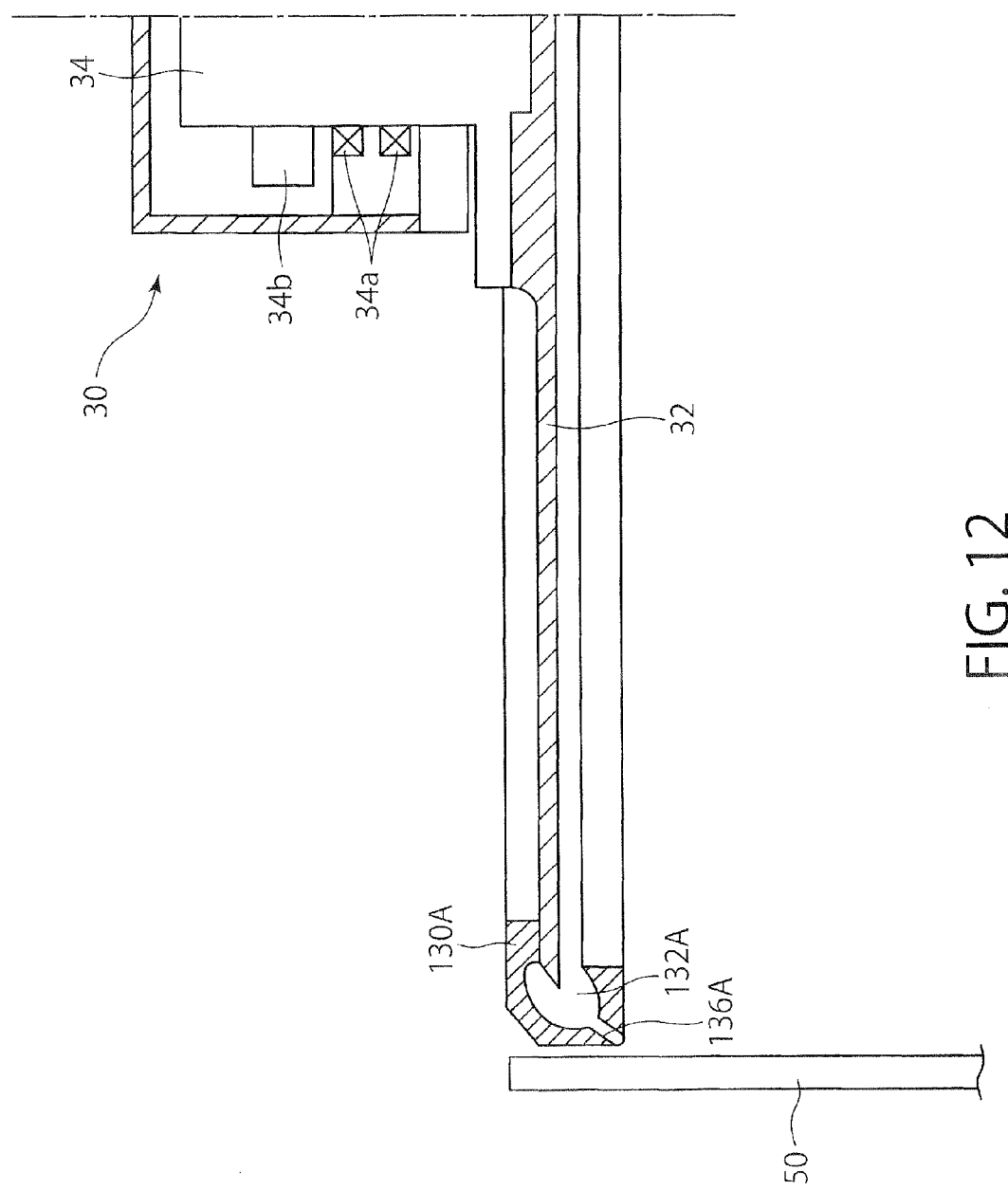

LIQUID TREATMENT APPARATUS

BACKGROUND OF THE INVENTION

Technical Field of the Invention

The present invention relates to a liquid treatment apparatus that performs predetermined processes to a substrate such as a cleaning process and an etching process, by supplying a treatment liquid to the substrate while rotating the substrate held in a horizontal position.

Description of Related Art

In a semiconductor device manufacturing process, a resist film having a predetermined pattern is formed on a process target film which is formed on a substrate such as a semiconductor wafer (hereinafter referred to as "wafer"), and the process target film is subjected to a process such as etching or ion implantation using the resist film as a mask. After the process, the unnecessary resist film is removed from the wafer.

A SPM treatment is typically used as a method for removing the resist film. The SPM treatment is performed by supplying the resist film with heated SPM solution (sulfuric acid hydrogen peroxide mixture) obtained by mixing sulfuric acid and hydrogen peroxide.

A device for performing a series of liquid treatments including the SPM treatment to a wafer is described in JP-A-2007-035866 (Patent Document 1). The device described therein includes: a spin chuck that rotates the wafer while holding the wafer in a horizontal position; a nozzle that supplies treatment liquids such as SPM solution and a rinse liquid (deionized water) to the wafer; and a splash guard (hereinafter referred to as "cup" in this specification) that receives a treatment liquid scattered radially outward from the upper surface of the wafer due to centrifugal force. Generally, since the SPM solution heated at a high temperature is discharged toward the wafer, the SPM treatment generates a fume comprising vapor and mist of the SPM solution and reactive products generated by the reaction of the SPM solution with a resist.

The device described in Patent Document 1 has a shielding plate (hereinafter also referred to as "top plate" in this specification) in order to prevent the fume from diffusing and contaminating the inside of a treatment chamber. During the SPM treatment, the shielding plate is placed near but above the wafer, while the shielding plate is not rotated.

The fume unavoidably adheres to a lower surface (surface facing the wafer) of the top plate. If condensed liquid droplets of the fume drop onto the wafer, the liquid droplets will contaminate the wafer. In order to avoid this, the top plate is cleaned every time the treatment to each wafer is completed. The device described in Patent Document 1 cleans the top plate by allowing a nozzle, dedicated to cleaning, to spray a cleaning liquid (for example, deionized water) to the lower surface of the top plate while rotating the top plate. Since the device described in Patent Document 1, however, does not have any parts radially outwardly of the top plate, it is probable that the fume components-dissolved cleaning liquid scatters into a space outside the cup and contaminates the inside of the treatment chamber.

SUMMARY OF THE INVENTION

The invention provides a liquid treatment apparatus capable of preventing a chemical liquid or a cleaning liquid adhering to a top plate from adhering to a substrate during chemical liquid treatment or top plate cleaning.

The invention provides a liquid treatment apparatus including: a substrate holder that holds a substrate in a horizontal position and rotates the substrate; a treatment liquid nozzle that supplies a treatment liquid to the substrate held by the substrate holder; a liquid receiving cup that is arranged outside of a peripheral edge of the substrate held by the substrate holder and receives the treatment liquid which has been supplied to the substrate by the treatment liquid nozzle; a top plate that covers the substrate held by the substrate holder from above; a top plate rotation driving mechanism that rotates the top plate; and a liquid receiving member that surrounds a peripheral edge of the top plate and has a circular liquid receiving space.

According to the invention, since a liquid that scatters from the top plate is received by the liquid receiving space, it is possible to prevent the liquid scattering from the top plate from adhering to the substrate.

BRIEF DESCRIPTION OF THE DRAWINGS

FIG. 6B is an enlarged vertical cross-sectional view of region VIB illustrated in FIG. 6A.

FIG. 12 is a vertical cross-sectional view of a configuration near a liquid receiving member included in a liquid treatment apparatus in another embodiment.

DETAILED DESCRIPTION OF THE INVENTION

Hereinafter, embodiments of the invention are described with reference to the accompanying drawings.

Figure 1:
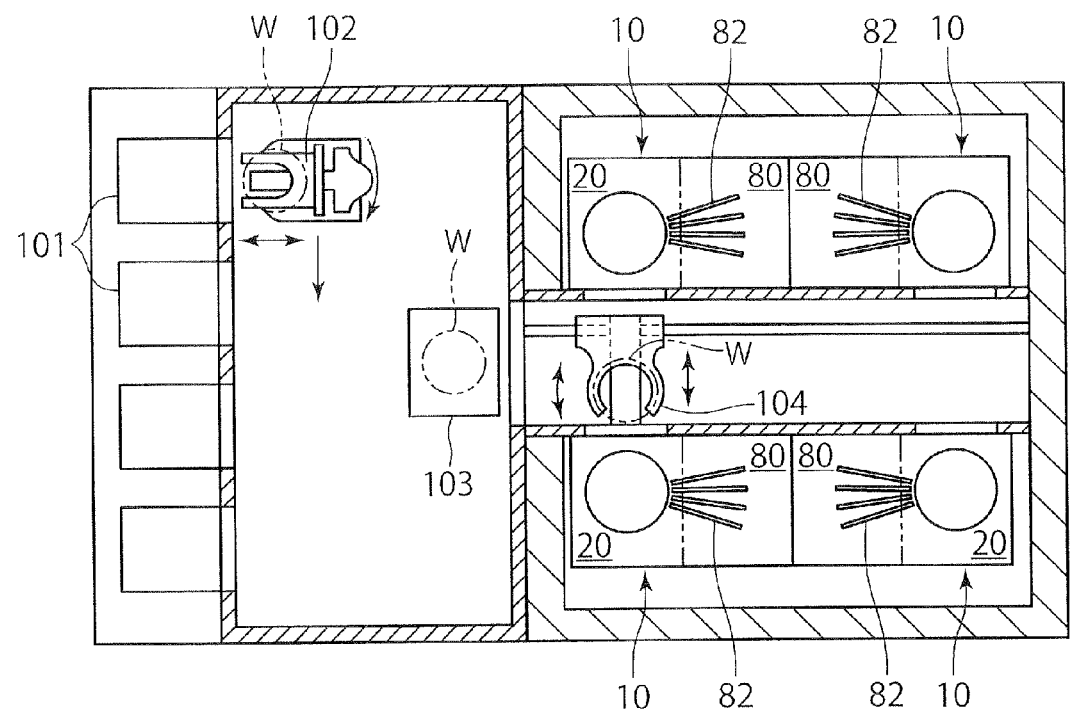
FIG. 1 is a top view, from above, of a liquid treatment system that includes a liquid treatment apparatus in one embodiment.

First, a liquid treatment system that includes liquid treatment apparatuses 10 in one embodiment is described with reference to FIG. 1. As illustrated in FIG. 1, the liquid treatment system includes: mount stage 101 for placement of carriers which are transferred from the outside of the system, and each of which stores substrates W such as semiconductor wafers (hereinafter also referred to as wafers W) as substrates to be treated; a carrying arm 102 that removes the wafers W stored in the carriers; a shelf unit 103 on which the wafers W thus removed by the carrying arm 102 are placed; and a carrying arm 104 that receives wafers W placed on the shelf unit 103 and transfers the wafers W into the liquid treatment apparatuses 10. As illustrated in FIG. 1, a plurality of (four, in the embodiment of FIG. 1) liquid treatment apparatuses 10 are arranged in the liquid treatment system.

Next, the schematic configuration of the liquid treatment apparatus 10 is described with reference to FIGS. 2 to 4.

Figure 2:
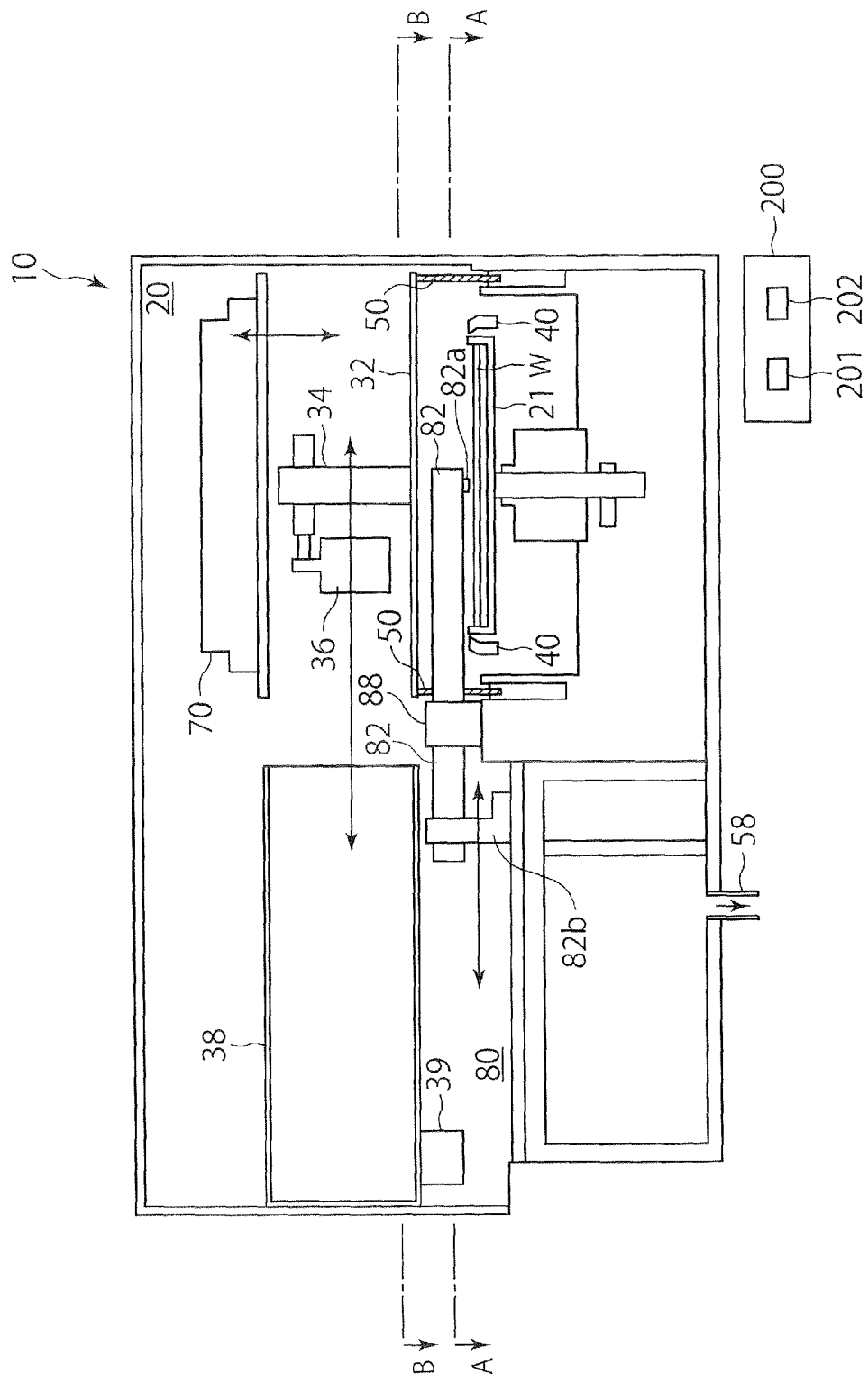
FIG. 2 is a side view schematically illustrating an overall configuration of the liquid treatment apparatus illustrated in FIG. 1.
Figure 3:
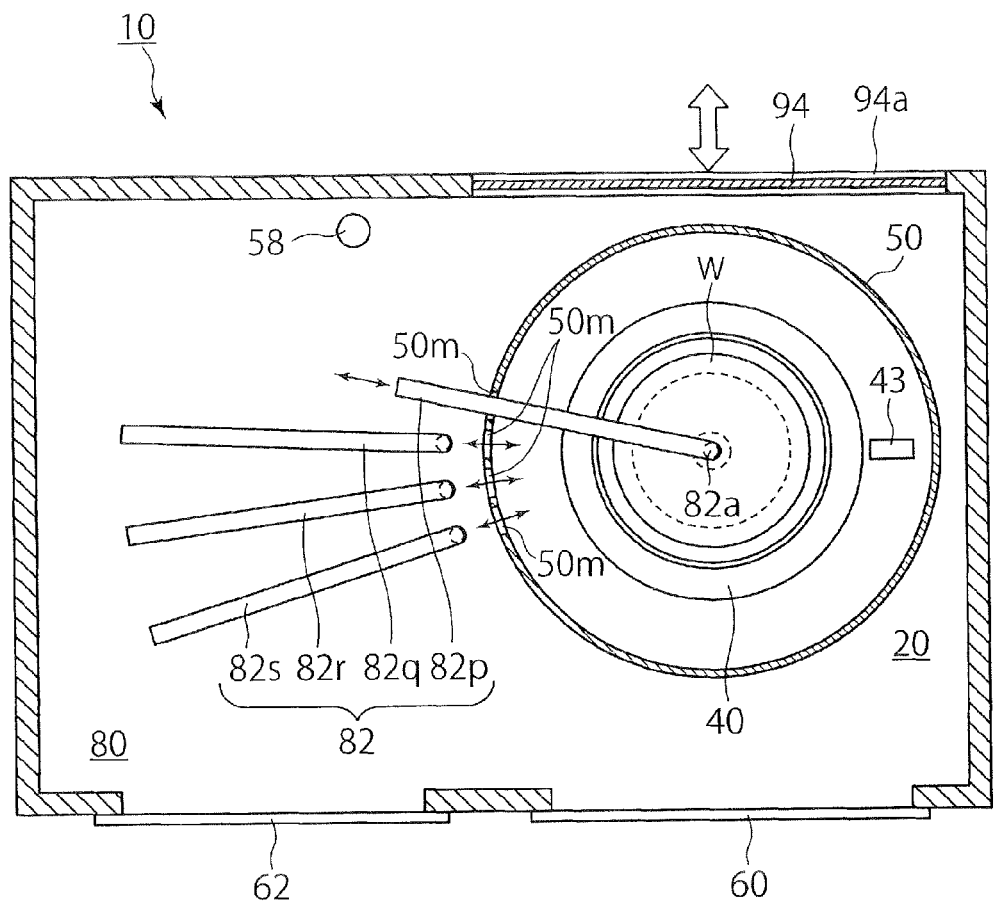
FIG. 3 is a top view of the liquid treatment apparatus, taken along line A-A illustrated in FIG. 2.
Figure 4:
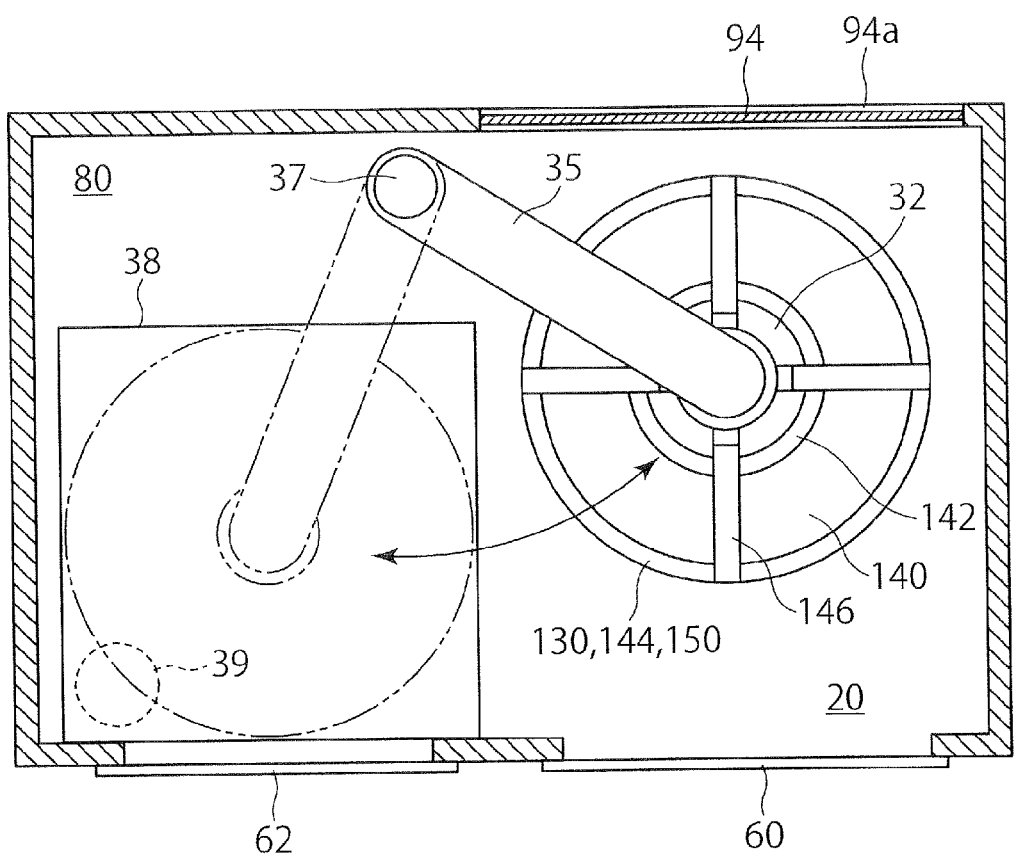
FIG. 4 is a top view of the liquid treatment apparatus, taken along a line B-B illustrated in FIG. 2.

As illustrated in FIGS. 2 to 4, the liquid treatment apparatus 10 includes: a chamber 20 in which a wafer W is contained and a liquid treatment is performed to the contained wafer W; and a standby area 80 located adjacent to the chamber 20. The liquid treatment apparatus 10 in the present embodiment does not have a partitioning wall for separating the chamber 20 and the standby area 80 from each other, and the chamber 20 and the standby area 80 are thus communicated with each other.

As illustrated in FIG. 2, a substrate holder 21 is arranged in the chamber 20 to rotate the wafer W while holding the wafer W in a horizontal position. A ring-shaped rotary cup (liquid receiving cup) 40 surrounds the substrate holder 21. The rotary cup 40 receives a treatment liquid which has been supplied to the wafer W in the liquid treatment performed to the wafer W. As illustrated in FIGS. 2 and 3, a cylindrical outer cup 50 is arranged around the rotary cup 40 in the chamber 20. As described later, the cylindrical outer cup 50 is capable of moving up and down depending on the treatment status of the wafer W. Detailed configurations of the substrate holder 21, rotary cup 40 and cylindrical outer cup 50 are described later.

As illustrated in FIG. 2, the liquid treatment apparatus 10 includes nozzles (advancing/retracting nozzles) 82a and nozzle support arms 82 that hold the nozzles 82a. The nozzles 82a supply treatment liquids to the wafer W held by the substrate holder 21 from above. As illustrated in FIG. 3, one liquid treatment apparatus 10 includes the plurality of nozzle support arms 82 (four nozzle support arms, for example). The nozzles 82a are arranged on the tip portions of the nozzle support arms 82, respectively. As illustrated in FIG. 2, arm support part 82b are arranged for the nozzle support arms 82, respectively. Each arm support part 82b is driven and moved by a driving mechanism (not illustrated) in a left-right direction of FIG. 2. Thus, each nozzle support arm 82 moves linearly in a horizontal direction between an advanced position in which the nozzle support arm 82 advances into the cylindrical outer cup 50 through its side opening 50m (described later) and a retracted position at which the nozzle support arm 82 is retracted from the cylindrical outer cup 50 (refer to arrows attached to the nozzle support arms 82 in FIGS. 2 and 3).

As illustrated in FIGS. 2 and 4, a top plate 32, for covering the wafer W held by the substrate holder 21 from above, is arranged so as to be movable in the horizontal direction. Specifically, the top plate 32 moves between an advanced position that is indicated by a solid line illustrated in FIG. 4 and at which the top plate covers the wafer W held by the substrate holder 21 and a retracted position that is indicated by an alternate long and two short dashes line illustrated in FIG. 4 and at which the top plate 32 is retracted from the advanced position in the horizontal direction and then located. A detailed configuration of the top plate 32 is described later.

As illustrated in FIG. 2, an air hood 70 for covering the wafer W held by the substrate holder 21 from above is arranged so as to be movable up and down. $N_2$ gas (nitrogen gas) and cleaned gas such as clean air flow down from the air hood 70. Specifically, the air hood 70 is capable of moving up and down between a lowered position at which the air hood 70 covers the wafer W held by the substrate holder 21 from above and a lifted position located above the lowered position. FIG. 2 illustrates a state in which the air hood 70 is located at the lifted position. A detailed configuration of the air hood 70 is described later.

As illustrated in FIGS. 2 and 3, an exhaust part 58 is provided at a bottom part of the standby area 80 arranged on the outer side of the cylindrical outer cup 50. An atmosphere within the standby area 80 is discharged via the exhaust part 58. Specifically, particles generated by the driving mechanism (not illustrated) for driving the nozzle support arms 82 can be evacuated from the exhaust part 58.

As illustrated in FIGS. 3 and 4, shutters 60 and 62 are arranged at openings for maintenance of the chamber 20 and standby area 80 of the liquid treatment apparatus 10. Since the shutters 60 and 62 for maintenance are arranged for the chamber 20 and the standby area 80, respectively, devices within the chambers 20 and devices within the standby area 80 can be individually maintained.

As illustrated in FIG. 3, a side wall of the liquid treatment apparatus 10 is provided with an opening 94a for loading and unloading the wafer W into and from the chamber 20. A shutter 94 for opening and closing the opening 94a is disposed at the opening 94a.

Next, details of the constituent elements of the liquid treatment apparatus 10 illustrated in FIGS. 2 to 4 are described with reference to FIGS. 5 to 8.

Figure 5:
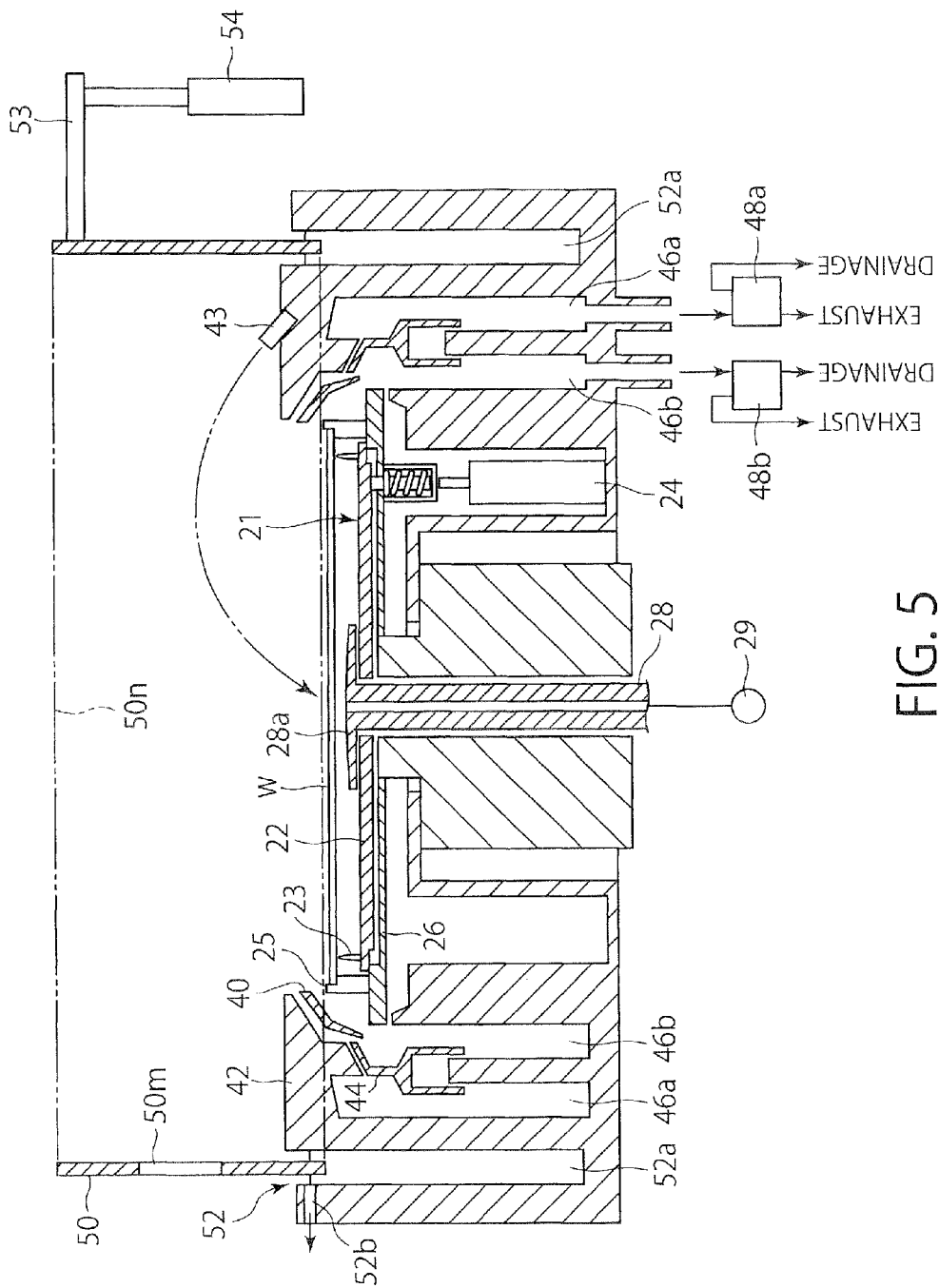
FIG. 5 is a vertical cross-sectional view of a substrate holder included in the liquid treatment apparatus illustrated in FIG. 2 and constituent elements located near the substrate holder.

First, the substrate holder 21 is described with reference to FIG. 5. FIG. 5 is a vertical cross-sectional view of the substrate holder 21 and constituent elements of the liquid treatment apparatus 10 located near the substrate holder 21.

As illustrated in FIG. 5, the substrate holder 21 has a disk-shaped holding plate 26 for holding the wafer W and a disk-shaped lift pin plate 22 disposed over the holding plate 26. Three lift pins 23 for supporting the wafer W from below are arranged on an upper surface of the lift pin plate 22 at equal intervals in a circumferential direction. FIG. 5 illustrates only two of the lift pins 23. A piston mechanism 24 is arranged under the lift pin plate 22, which is moved up and down by the piston mechanism 24. Specifically, in order for the carrying arm 104 (refer to FIG. 1) to place the wafer W on the lift pins 23 or remove the wafer W from the lift pins 23, the lift pin plate 22 is moved up by the piston mechanism 24 from the position illustrated in FIG. 5 and thereby positioned above the rotary cup 40. When a liquid treatment, a drying treatment and the like is performed to the wafer W in the chamber 20, the lift pin plate 22 is moved down to the lowered position illustrated in FIG. 5 by the piston mechanism 24 so that the rotary cup 40 is located around the wafer W.

The holding plate 26 has three holding members 25 arranged at equal intervals in the circumferential direction to hold the wafer W from the side. FIG. 5 illustrates only two of the holding members 25. When the lift pin plate 22 is moved from the lifted position to the lowered position, the holding members 25 hold the wafer W from the side so that the wafer W is slightly removed from the lift pins 23.

The lift pin plate 22 and the holding plate 26 each have a through-hole at a central portion thereof, and a treatment liquid supply pipe 28 extends through the through-holes. Treatment liquids of various types such as chemical liquid and deionized water are supplied through the treatment liquid supply pipe 28 to a back surface of the wafer W held by the holding members 25 of the holding plate 26. The treatment liquid supply pipe 28 moves up and down together with the lift pin plate 22. A head portion 28a is formed on an upper end of the treatment liquid supply pipe 28 so as to close the through-hole of the lift pin plate 22. As illustrated in FIG. 5, the treatment liquid supply pipe 28 is connected to a treatment liquid supply unit 29. The treatment liquids of the various types are supplied by the treatment liquid supply unit 29 to the treatment liquid supply pipe 28.

The ring-shaped rotary cup 40 is attached to the holding plate 26. Thus, the rotary cup 40 is rotated integrally with the holding plate 26 via a connecting member (not illustrated). As illustrated in FIG. 5, the rotary cup 40 surrounds the wafer W held by the holding members 25 of the holding plate 26 from the side of the wafer W. Thus, the rotary cup 40 can receive a treatment liquid laterally scattered from the wafer W during the liquid treatment performed to the wafer W.

A drain cup 42 and a guide cup 44 are each arranged around the rotary cup 40. The drain cup 42 and the guide cup 44 are each formed in a ring shape. The drain cup 42 and the guide cup 44 each have an opening at an upper portion thereof. The position of the drain cup 42 is fixed in the chamber 20. The guide cup 44 is coupled to a lifting cylinder (not illustrated) and moved up and down by the lifting cylinder.

As illustrated in FIG. 5, a first discharging part 46a and a second discharging part 46b are arranged under the drain cup 42 and the guide cup 44. A treatment liquid that is laterally scattered from the wafer W during the liquid treatment performed on the wafer W is selectively delivered to one of the two discharging parts 46a and 46b depending on the vertical position of the guide cup 44, on the basis of the type of the treatment liquid. Specifically, when the guide cup 44 is located at its lifted position (in a state illustrated in FIG. 5), a predetermined treatment liquid, e.g., SC-1 liquid (described later), laterally scattered from the wafer W is delivered to the second discharging part 46b. On the other hand, when the guide cup 44 is located at its lowered position, a predetermined treatment liquid, e.g., SPM solution (described later), laterally scattered from the wafer W is delivered to the first discharging part 46a. As illustrated in FIG. 5, the first and second discharging parts 46a and 46b are connected to gas-liquid separators 48a and 48b, respectively. Not only the liquid but the gases are discharged via the first and second discharging parts 46a and 46b. As illustrated in FIG. 5, the gas-liquid separators 48a and 48b separate the treatment liquids and gas delivered from the first and second discharging units 46a and 46b, which are to be drained and exhausted.

As illustrated in FIG. 5, a fixed rinse nozzle 43 for supplying deionized water toward the center of the wafer W is arranged on the drain cup 42. A rinse liquid such as the deionized water is discharged by the fixed rinse nozzle 43 toward the center of the wafer W while following a parabolic trajectory (refer to an alternate long and two short dashes line illustrated in FIG. 5).

In the liquid treatment apparatus 10 in the present embodiment, the cylindrical outer cup 50 is arranged around the drain cup 42 and the guide cup 44, within the chamber 20. As illustrated in FIG. 5, a holding member 53 for holding the cylindrical outer cup 50 is coupled to an upper portion of the cylindrical outer cup 50, and a driving mechanism 54 for moving up and down the holding member 53 is attached to the holding member 53. The holding member 53 is moved up and down by the driving mechanism 54 and whereby the cylindrical outer cup 50 can move up and down between a lifted position at which an upper edge of the cylindrical outer cup 50 is located above the rotary cup 40 and a lowered position located under the lifted position, as illustrated in FIG. 5. As illustrated in FIGS. 3 and 5, the side openings 50m through which the nozzle support arms 82 can pass are formed in a side surface of the cylindrical outer cup 50. As illustrated in FIG. 5, the cylindrical outer cup 50 has an upper opening 50n formed at an upper portion thereof. When the cylindrical outer cup 50 is located at the lifted position and the top plate 32 is located at the advanced position, the upper opening 50n is closed by the top plate 32.

As illustrated in FIG. 5, a cleaning unit 52 for cleaning the cylindrical outer cup 50 is arranged in the chamber 20. The cleaning unit 52 has a storage portion 52a for storing a cleaning liquid such as deionized water. When the cylindrical outer cup 50 is located at the lowered position, the cylindrical outer cup 50 is dipped in the cleaning liquid stored in the storage portion 52a. When the cylindrical outer cup 50 is dipped in the cleaning liquid stored in the storage portion 52a, the cylindrical outer cup 50 is cleaned by the cleaning unit 52.

The storage portion 52a is connected to a cleaning liquid supply pipe (not illustrated) through which the cleaning liquid is continuously supplied to the storage portion 52a. A drain pipe 52b is installed in a side part of the storage portion 52a. The cleaning liquid stored in the storage portion 52a is discharged from the drain pipe 52b. Specifically, since the cleaning liquid is continuously supplied to the storage portion 52a through the cleaning liquid supply pipe, stored in the storage portion 52a, and discharged from the drain pipe 52b, the cleaning liquid stored in the storage portion 52a is cleaned.

As illustrated in FIG. 3, in the present embodiment, the liquid treatment apparatus 10 has the plurality of (specifically, four, for example) nozzle support arms 82, at the tip portions of which are each provided with the nozzle 82a. As illustrated in FIG. 2, each nozzle support arm 82 is provided with the arm support part 82b, and is driven in the left-right direction of FIG. 2 by the driving mechanism (not illustrated). Thus, each nozzle support arm 82 performs linear motion between the advanced position in which the nozzle support arm 82 is advanced through the side openings 50m into the outer cup 50, and the retracted position at which the nozzle support arm 82 is retracted from the cylindrical outer cup 50 (refer to the arrows illustrated in FIGS. 2 and 3 for the nozzle support arm 82).

As illustrated in FIG. 2, arm cleaning units 88 are arranged in the liquid treatment apparatus 10 to clean the nozzle support arms 82, respectively. Specifically, the position of the arm cleaning unit 88 is fixed, and a storage portion (not illustrated) storing a cleaning liquid is provided in the arm cleaning unit 88. During movements of the nozzle support arm 82 from the advanced position to the retracted position or from the retracted position to the advanced position, a part of the nozzle arm 82 is brought into contact with the cleaning liquid stored in the storage portion so that the nozzle support arm 82 is cleaned.

Fluids discharged from the nozzles 82a of the four nozzle support arms 82 (82p to 82s) are described in detail below with reference to FIGS. 8A to 8D.

As illustrated in FIG. 8(a), the nozzle 82a of the first nozzle support arm 82p among the four nozzle support arms 82 faces downward, and SPM solution obtained by mixing a sulfuric acid with a hydrogen peroxide solution is discharged from the nozzle 82a of the first nozzle support arm 82p. Specifically, a treatment liquid supply pipe 83a connected to the nozzle 82a is installed in the first nozzle support arm 82p. A hydrogen peroxide solution supply unit 83b and a sulfuric acid supply unit 83c that are arranged in parallel are connected to the treatment liquid supply pipe 83a through flow rate regulating valves and on-off valves, respectively. In addition, a heater 83d for heating the sulfuric acid supplied from the sulfuric acid supply unit 83c is provided. The hydrogen peroxide solution supplied from the hydrogen peroxide solution supply unit 83b and the sulfuric acid supplied from the sulfuric acid supply unit 83c are mixed with each other, and the SPM solution obtained by the mixing the hydrogen peroxide solution with the sulfuric acid is delivered to the nozzle 82a of the first nozzle support arm 82p through the treatment liquid supply pipe 83a. In addition, while the sulfuric acid supplied from the sulfuric acid supply unit 83c is heated by the heater 83d, reaction heat is generated by a chemical reaction that occurs upon the mixing of the sulfuric acid with the hydrogen peroxide solution. Thus, the temperature of the SPM solution discharged from the nozzle 82a of the first nozzle support arm 82p is high, for example, 100° C. or higher, preferably, approximately 170° C.

As illustrated in FIG. 8(b), the nozzle 82a of the second nozzle support arm 82q among the four nozzle support arms 82 faces upward, and a top plate cleaning liquid for cleaning the top plate 32 is discharged upward from the nozzle 82a of the nozzle support arm 82q. Specifically, a top plate cleaning liquid supply pipe 84a connected to the nozzle 82a is installed in the second nozzle support arm 82q, and a top plate cleaning supply unit 84b is connected to the top plate cleaning liquid supply pipe 84a through a flow rate regulating valve and an on-off valve. The top plate cleaning liquid (such as deionized water) for cleaning the top plate 32 is supplied from the top plate cleaning liquid supply unit 84b and delivered to the nozzle 82a of the second nozzle support arm 82q through the top plate cleaning liquid supply pipe 84a.

As illustrated in FIG. 8(c), the nozzle 82a of the third nozzle support arm 82r among the four nozzle support arms 82 faces downward, and heated water and a mixed liquid obtained by mixing ammonia water with a hydrogen peroxide solution (hereinafter also referred to as "SC-1 liquid") is discharged downward from the nozzle 82a of the third nozzle support arm 82r toward the wafer W. Specifically, a treatment liquid supply pipe 85a connected to the nozzle 82a is installed in the third nozzle support arm 82r. In addition, a hydrogen peroxide solution supply unit 85b, an ammonia water supply unit 85c, a deionized water supply unit 85d and a deionized water supply unit 85f are arranged in parallel and connected to the treatment liquid supply pipe 85a through flow rate regulating valves and on-off valves, respectively. Furthermore, a heater 85e for heating deionized water supplied from the deionized water supply unit 85d is provided. While the on-off valves corresponding to the deionized water supply units 85d and 85f are closed, the SC-1 liquid is generated by mixing the hydrogen peroxide solution supplied from the hydrogen peroxide solution supply unit 85b with the ammonia water supplied from the ammonia water supply unit 85c and is delivered to the nozzle 82a of the third nozzle support arm 82r through the treatment liquid supply pipe 85a. While the on-off valves corresponding to the hydrogen peroxide solution supply unit 85b, the ammonia water supply unit 85c and the deionized water supply unit 85f are closed, deionized water supplied from the deionized water supply unit 85d can be heated by the heater 85e, and the heated deionized water can be delivered to the nozzle 82a of the third nozzle support arm 82r through the treatment liquid supply pipe 85a. Furthermore, while on-off valves corresponding to the hydrogen peroxide solution supply unit 85b, the ammonia water supply unit 85c and the deionized water supply unit 85d are closed, room-temperature deionized water supplied from the deionized water supply unit 85f can be delivered to the nozzle 82a of the third nozzle support arm 82r. The temperatures of the SC-1 liquid and deionized water that are discharged from the nozzle 82a of the third nozzle support arm 82r are lower than the temperature of the SPM solution discharged from the nozzle 82a of the first nozzle support arm 82p and are, for example, lower than 80° C.

As illustrated in FIG. 8(d), the nozzle 82a of the fourth nozzle support arm 82s among the four nozzle support arms 82 is a two-fluid nozzle facing downward. Specifically, the nozzle 82a of the fourth nozzle support arm 82s is connected to a deionized water supply pipe 86a and an $N_2$ gas supply pipe 86c. The deionized water supply pipe 86a is connected to a deionized water supply unit 86b, while the $N_2$ gas supply pipe 86c is connected to a $N_2$ gas supply unit 86d. Deionized water supplied from the deionized water supply unit 86b through the deionized water supply pipe 86a and $N_2$ gas supplied from the $N_2$ gas supply unit 86d through the $N_2$ gas supply pipe 86c are mixed with each other in the two-fluid nozzle, and whereby deionized water droplets are sprayed downward from the two-fluid nozzle.

In the present embodiment, the vertical position of the second nozzle support arm 82q is higher than the vertical position of the third nozzle support arm 82r. Thus, when the second nozzle support arm 82q and the third nozzle support arm 82r simultaneously advance into the cylindrical outer cup 50, the arms 82q and 82r do not collide or interfere with each other. Thus, a process of supplying the cleaning liquid from the nozzle 82a of the second nozzle support arm 82q to the top plate 32 and a process of supplying SC-1 liquid or deionized water from the nozzle 82a of the third nozzle support arm 82r to the water W can be simultaneously performed.

When the nozzle support arms 82 are located at the retracted positions, the tip portions of the nozzle support arms 82 respectively close the side openings 50m of the cylindrical outer cup 50 located at the lifted position. This prevents an atmosphere within the cylindrical outer cup 50 from leaking from the side opening 50m to the outside of the cylindrical outer cup 50.

Next, the detailed structure of the top plate 32 and constituent elements located near the top plate 32 are described with reference to FIGS. 4, 6A and 6B.

Figure 6A:
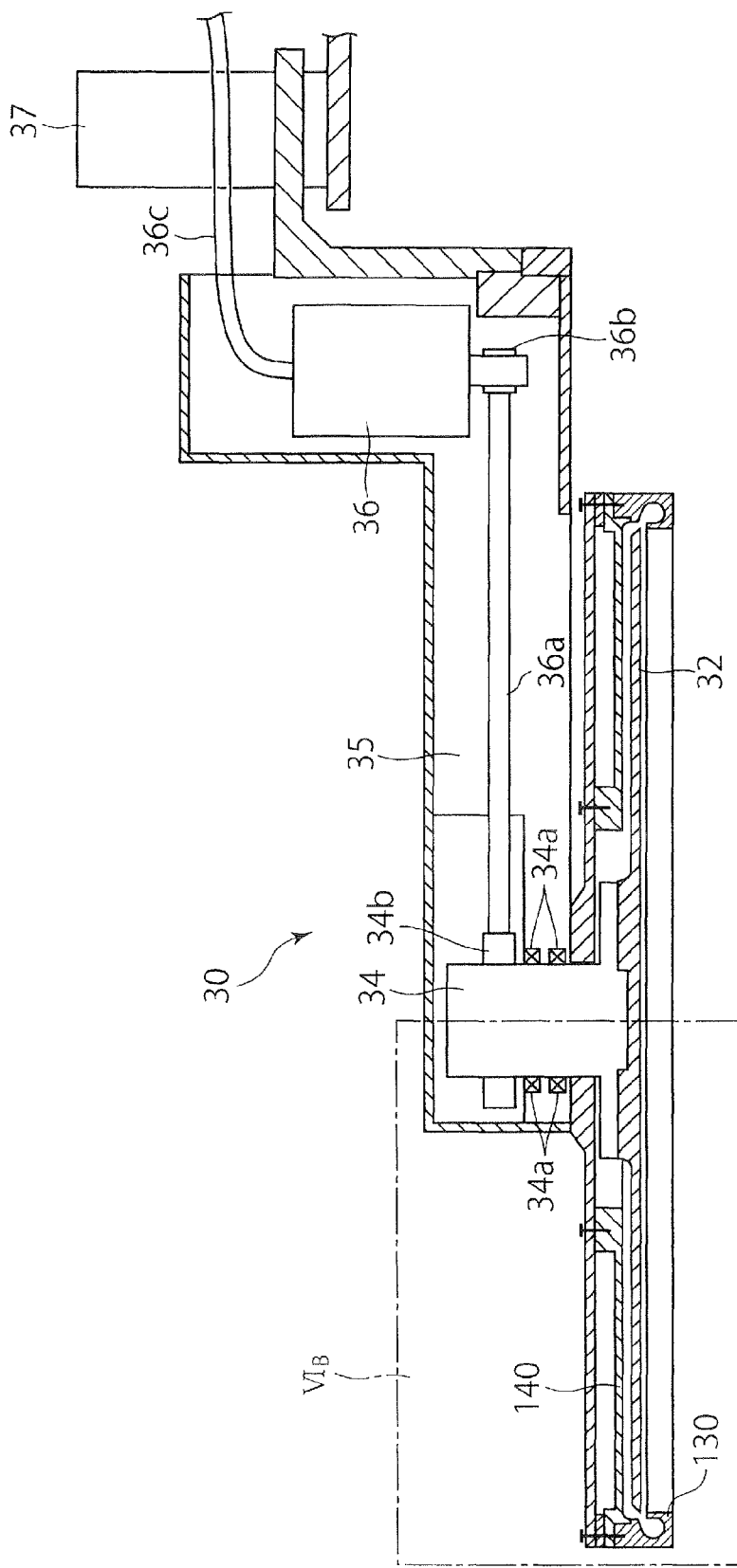
FIG. 6A is a vertical cross-sectional view of a top plate included in the liquid treatment apparatus illustrated in FIG. 2 and constituent elements located near the top plate.

As illustrated in FIG. 6A, the top plate 32 is held by a top plate holding arm 35. A rotary shaft 34 is attached to an upper portion of the top plate 32, while bearings 34a are arranged between the rotary shaft 34 and the top plate holding arm 35. Thus, the rotary shaft 34 can rotate with respect to the top plate holding arm 35. A pulley 34b is attached to the rotary shaft 34. A servo motor 36 is attached to a proximal portion of the top plate holding arm 35, while a pulley 36b is attached to the tip portion of the servo motor 36. A single endless timing belt 36a is wound around the pulley 34b of the rotary shaft 34 and the pulley 36b of the servo motor 36. Rotational driving force generated by the servo motor 36 is transmitted to the rotary shaft 34 by the timing belt 36a, and whereby the top plate 32 rotates around the rotary shaft 34. A cable 36c is connected to the servo motor 36. Electric power is supplied from the outside of the casing of the liquid treatment apparatus 10 through the cable 36c to the servo motor 36. The rotary shaft 34, the timing belt 36a, the servo motor 36 and so on form a top plate rotation mechanism for rotating the top plate 32 in a horizontal plane.

A ring-shaped liquid receiving member 130 is arranged adjacent to a peripheral edge of the top plate 32 to receive a liquid (for example, a condensed substance of the fume) that has adhered to the back surface of the top plate 32 and then scattered radially outward due to centrifugal force. The liquid receiving member 130 has therein a ring-shaped liquid receiving space 132 opening toward the peripheral edge of the top plate 32. The liquid receiving member 130 has a rim member 134 extending upward and forming an inner peripheral edge of the liquid receiving space 132. It is preferable that the peripheral edge of the top plate 32 be located radially outside the rim member 134 so that the liquid scattered from the top plate 32 reliably drops into the liquid receiving space 132.

One or more discharge ports 136 connected to the liquid receiving space 132 (see FIG. 6B) are formed in the liquid receiving member 130. The discharge port 136 is connected to a discharge pipe 137c on which a mist separator 137a and an ejector 137b are installed. The liquid receiving space 132 can be suctioned when necessary. By suctioning the liquid receiving space 132, the liquid within the liquid receiving space 132 can be efficiently discharged into the discharge pipe 137c. In addition, by suctioning the liquid receiving space 132, airflow that is directed toward the inside of the liquid receiving space 132 is generated in the vicinity of a lower surface of the peripheral edge of the top plate 32, and the liquid that reaches the peripheral portion of the top plate 32 is drawn into the liquid receiving space 132 by the airflow. Thus, the liquid can be reliably introduced into the liquid receiving space 132. The liquid is separated by the mist separator 137a and discharged into a factory drainage system (DR), while waste gas is discharged from the ejector 137b into a factory exhaust system (EXH). If only one discharge port 136 is to be provided, it is preferable that the discharge port 136 be provided under the arm 35 (refer to FIG. 4) in order to simplify the installation of the discharge pipe 137c.

A circular flow rectifying plate 140 that is non-rotatable is installed above the top plate 32 that is rotatable. A space 141 is defined between an upper surface of the top plate 32 and a lower surface of the flow rectifying plate 140. The peripheral portion of the lower surface of the flow rectifying plate 140 is connected to an inner upper surface 138, defining the liquid receiving space 132, of the liquid receiving member 130. Thus, when the liquid receiving space 132 is suctioned by the ejector 137b, air flow, which flows radially outward in the space 141 between the top plate 32 and the flow rectifying plate 140, is generated. The air flow thus generated passes through the gap between the peripheral edge of the top plate 32 and the inner upper surface 138 of the liquid receiving member 130 and flows into the liquid receiving space 132. Thus, the liquid that flows into the liquid receiving space 132 through the gap between the peripheral edge of the top plate 32 and the rim member 134 of the liquid receiving member 130 does not outflow into a space above the top plate 32 through the gap between the peripheral edge of the top plate 32 and the inner upper surface 138 of the liquid receiving member 130.

The liquid receiving member 130 and the flow rectifying plate 140 are held by a plurality of (four, in the present embodiment) holding arms 146 that are fixed to the top plate holding arm 35 and radially extend from the top plate holding arm 35. An attachment ring 150, an outer circumferential portion 144 of the flow rectifying plate 140 and the liquid receiving member 130 are stacked in this order from above on lower surfaces of edge portions of the holding arms 146 and fastened by bolts 148a. In addition, an inner circumferential portion 142 of the flow rectifying plate 140 is fastened to lower surfaces of proximal end portions of the holding arms 146 by bolts 148b. Thus, in the illustrated configuration example, the top plate 32, the liquid receiving member 130 and the flow rectifying plate 140 are held by the top plate holding arm 35 serving as a common holding member to move together as a single unit. Only the top plate 32 is rotatable around a vertical straight axis, while the liquid receiving member 130 and the flow rectifying plate 140 do not rotate.

As illustrated in FIG. 6B, when the top plate 32 is located at the advanced position, a lower surface of the liquid receiving member 130 is in contact with an upper surface of the cylindrical outer cup 50 or is close to the upper surface of the cylindrical outer cup 50 with a small gap therebetween. Thus, a sealed or closed space that encompasses the wafer W is defined by the cylindrical outer cup 50, the liquid receiving member 130 and the top plate 32. A sealing member may be arranged on at least one of the lower surface of the liquid receiving member 130 and the upper surface of the cylindrical outer cup 50 so as to seal a gap between the lower surface of the liquid receiving member 130 and the upper surface of the cylindrical outer cup 50.

As illustrated in FIGS. 4 and 6A, a pivot shaft 37 is arranged at the proximal end of the top plate holding arm 35, and the top plate holding arm 35 pivots around the pivot shaft 37. Thus, the top plate 32 reciprocates between the advanced position (indicated by the solid line illustrated in FIG. 4) at which the top plate 32 covers the wafer W held by the substrate holder 21 from above and the retracted position (indicated by the alternate long and two dashes line illustrated in FIG. 4) at which the top plate 32 is retracted from the advanced position in the horizontal direction and then located.

As illustrated in FIGS. 2 and 4, a top plate storage unit 38 for storing the top plate 32 when the top plate 32 is retracted to the retracted position is installed in the standby area 80 of the liquid treatment apparatus 10. The top plate storage unit 38 has an opening formed in a side portion thereof. When the top plate 32 moves from the advanced position to the retracted position, the top plate 32 is entirely housed in the top plate storage unit 38 through the opening formed in the side portion of the top plate storage unit 38. In addition, a gas discharging unit 39 is arranged under the top plate storage unit 38. An atmosphere within the top plate storage unit 38 is discharged by the gas discharging unit 39. Even if liquid droplets of the treatment liquid such as SPM solution adheres to the lower surface of the top plate 32 during the liquid treatment of the wafer W, and the top plate 32 is stored in the top plate storage unit 38, an atmosphere of the treatment liquid such as the SPM solution is discharged by the gas discharging unit 39. Thus, the atmosphere of the treatment liquid does not flow into the standby area 80 and the chamber 20.

Figure 7:
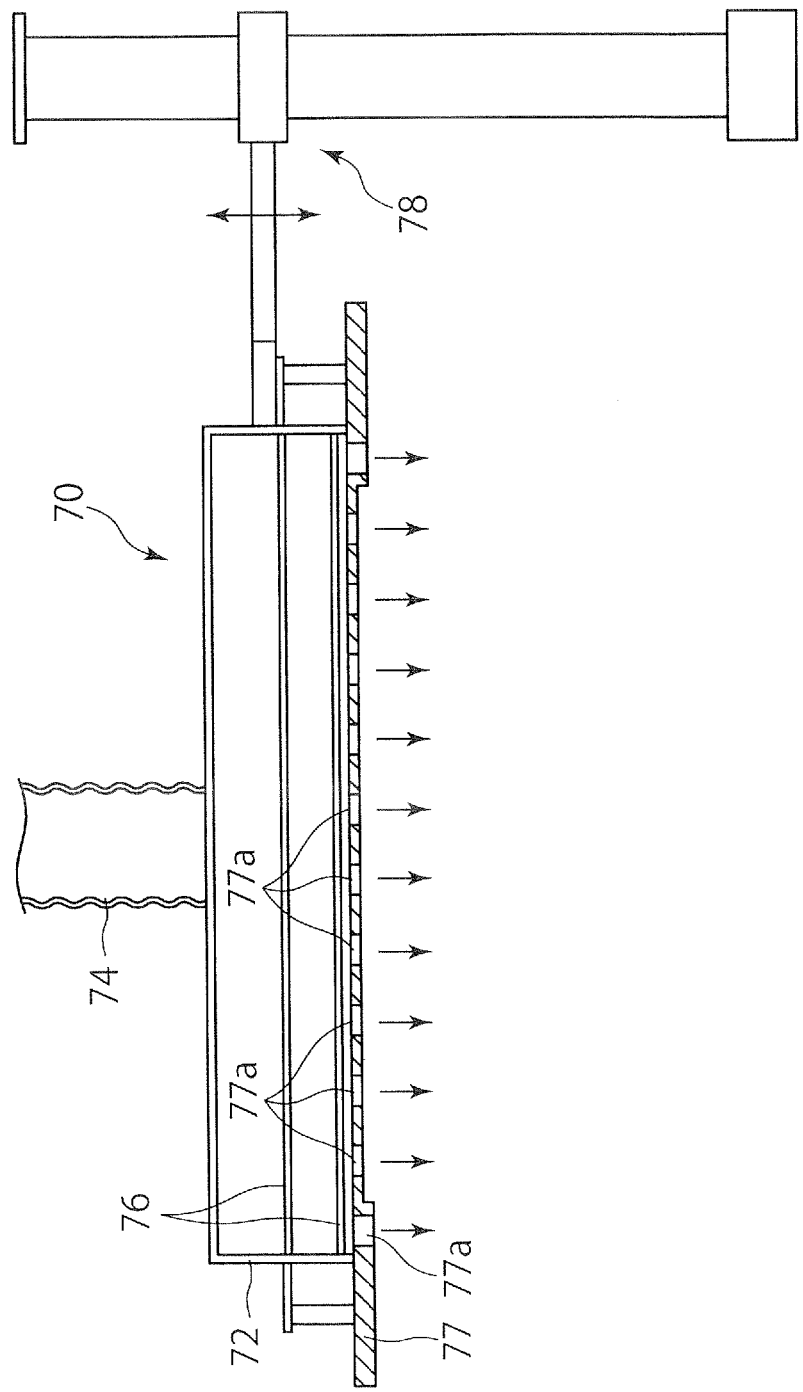
FIG. 7 is a vertical cross-sectional view of an air hood included in the liquid treatment apparatus illustrated in FIG. 2 and constituent elements located near the air hood.
Figure 8:
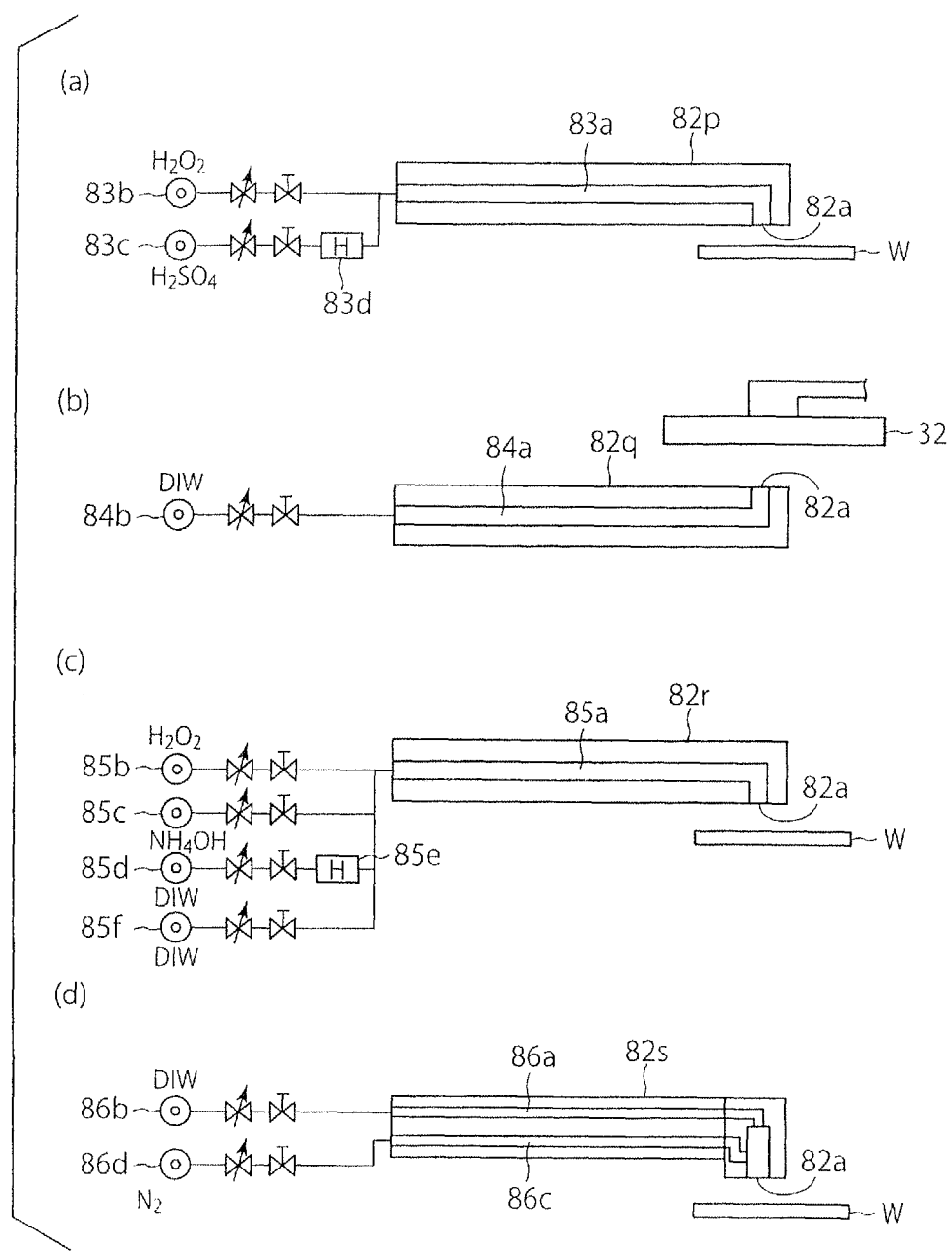
FIG. 8 shows diagrams illustrating configurations of nozzles and nozzle support arms in the liquid treatment apparatus illustrated in FIG. 2.

Next, the detailed structure of the air hood 70 and constituent elements located near the air hood 70 are described with reference to FIG. 7. FIG. 7 is a sectional side view of the air hood 70 and the constituent elements located near the air hood 70.

As illustrated in FIG. 7, the air hood 70 includes a casing 72 having a lower opening and a lower plate 77 having a plurality of apertures 77a, which may be a punching plate or the like, arranged at the lower portion of the casing 72. One or more filters 76 are arranged in the casing 72. In addition, a flexible duct 74 is connected to an upper portion of the casing 72. The flexible duct 74 communicates with an environment outside the housing of the liquid treatment apparatus 10. A fan (not illustrated) for drawing a gas into the casing 72 is arranged at a proximal end portion of the duct 74. The lower plate 77 has the apertures 77a allowing the gas within the casing 72 to flow downward. Thus, after the gas is delivered from the environment outside the housing of the liquid treatment apparatus 10 through the duct 74 into the casing 72, and particles contained in the gas are removed by the filter 76 in the casing 72, the cleaned gas flows downward from the apertures 77a of the lower plate 77.

As illustrated in FIG. 7, an air hood lifting mechanism 78 for moving up and down the air hood 70 is installed for the air hood 70. By the air hood lifting mechanism 78, the air hood 70 is moved up and down between the lowered position at which the air hood 70 covers the wafer W held by the substrate holder 21 and the lifted position located above the lowered position. As described above, FIG. 2 illustrates the state in which the air hood 70 is located at the lifted position.

As illustrated in FIG. 2, the liquid treatment apparatus 10 has a controller 200 for controlling overall operations of the liquid treatment apparatus 10. The controller 200 controls operations of all the functional parts (substrate holder 21, piston mechanism 24, servo motor 36, air hood lifting mechanism 78 and the like) of the liquid treatment apparatus 10. The controller 200 can be realized by a general-purpose computer serving as hardware and programs (apparatus control program, treatment recipes and the like) serving as software used to operate the computer. The software is stored in a storage medium such as a hard disk drive fixed to and included in the computer or is stored in a removable storage medium (such as a CD-ROM, DVD, and flash memory) set in the computer. The storage medium is indicated by a reference numeral 201 in FIG. 2. A processor 202 calls a predetermined treatment recipe from the storage medium 201 and executes the called treatment recipe on the basis of an instruction from a user interface (not illustrated) when necessary, and whereby functional parts of the liquid treatment apparatus 10 operate under control of the controller 200 and a predetermined treatment is performed. The controller 200 may be a system controller for controlling the overall liquid treatment system illustrated in FIG. 1.

Figure 9:
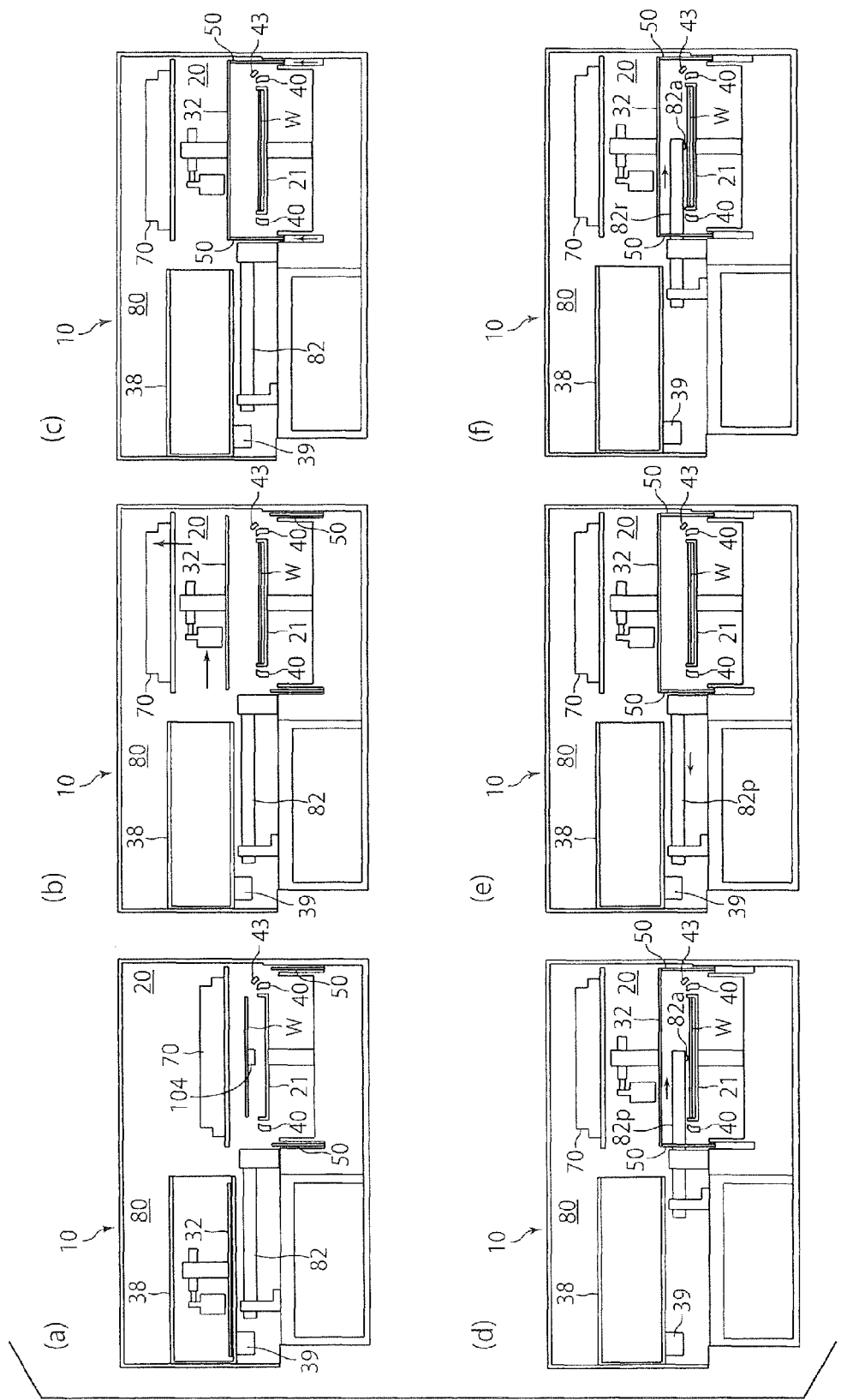
FIG. 9(a) to FIG. 9(f) are diagrams describing a series of steps of a wafer cleaning treatment that is performed by the liquid treatment apparatus illustrated in FIG. 2.
Figure 10:
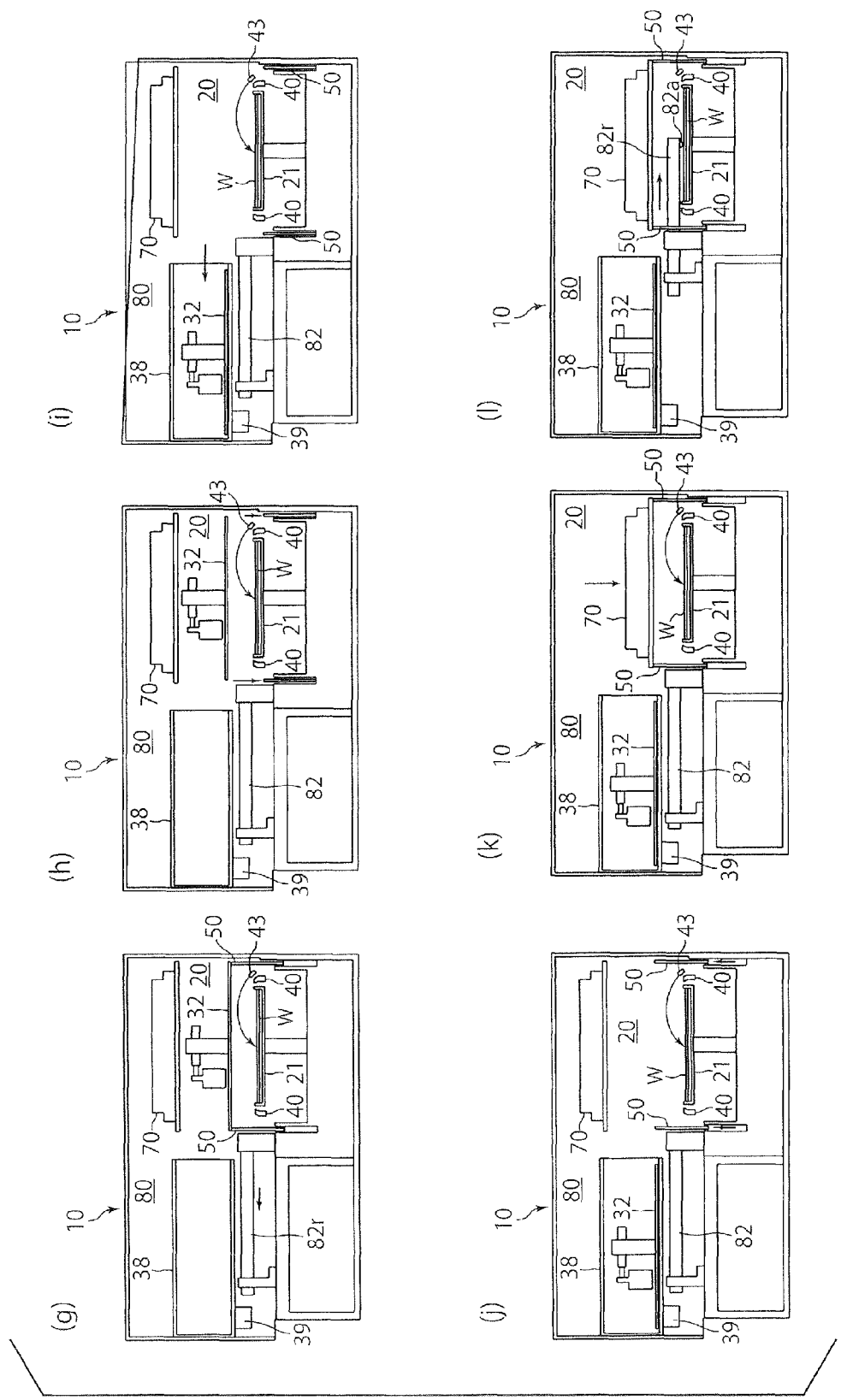
FIG. 10(g) to FIG. 10(l) are diagrams describing a series of steps of the wafer cleaning treatment that is performed by the liquid treatment apparatus illustrated in FIG. 2.
Figure 11:
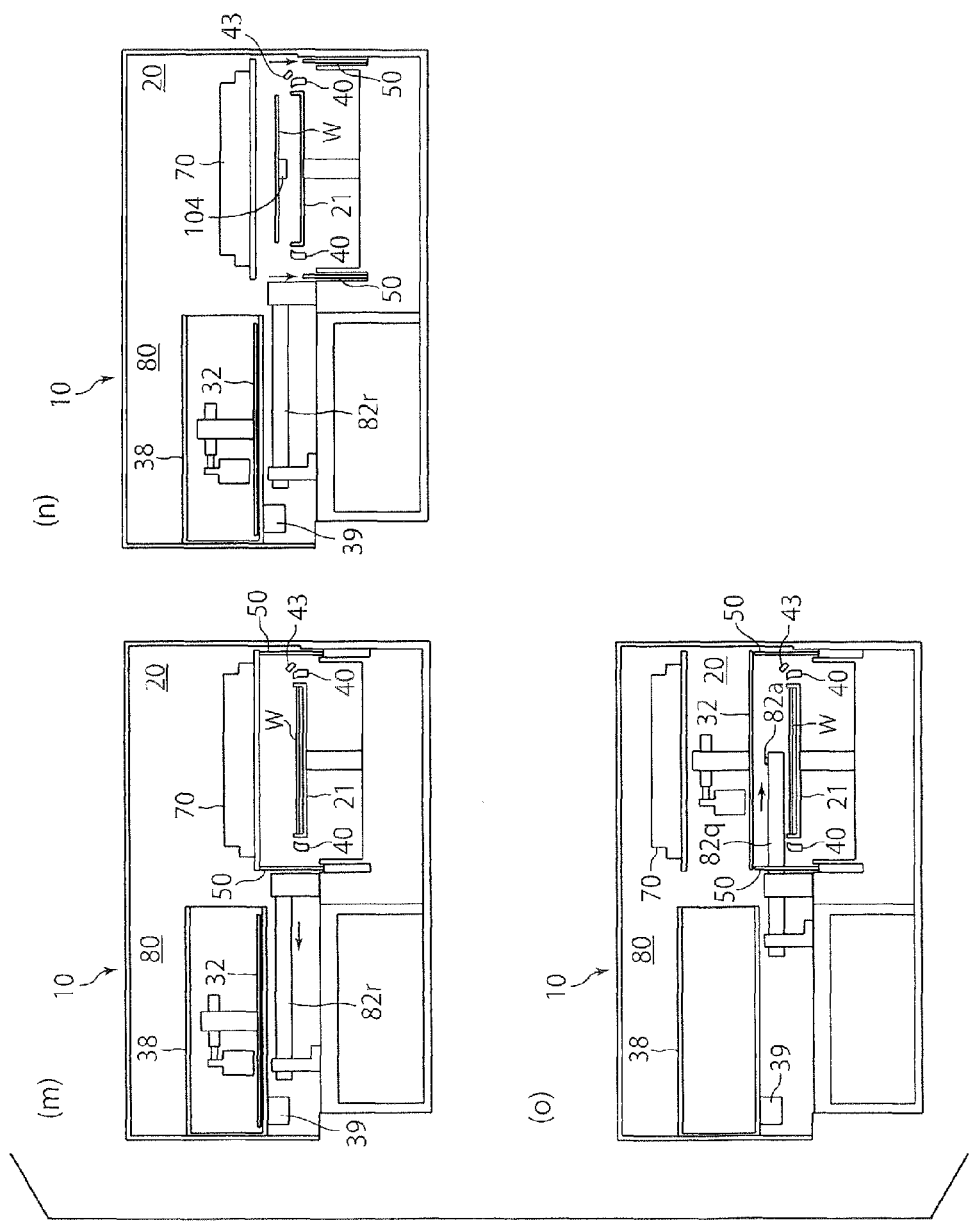
FIGS. 11(m) to 11(o) are diagrams describing a series of steps of the wafer cleaning treatment that is performed by the liquid treatment apparatus illustrated in FIG. 2.

Next, a series of steps of a cleaning treatment for removing an unnecessary resist film on the upper surface of the wafer W is described with reference to FIG. 9 to FIG. 11. The series of steps of the cleaning treatment described below is performed by causing the controller 200 to control the operations of the functional parts of the liquid treatment apparatus 10. In FIG. 9 to FIG. 11, the constituent members of the liquid treatment apparatus are illustrated in a significantly simplified manner for easy understanding.

First, the top plate 32 is moved to the retracted position and stored in the top plate storage unit 38 as illustrated in FIG. 9(a). In addition, the air hood 70 is moved down from the lifted position (illustrated in FIG. 2) to place it at the lowered position. Furthermore, the cylindrical outer cup 50 is moved to the lowered position so as to open a side portion of the substrate holder 21. In this state, the lift pin plate 22 of the substrate holder 21 and the treatment liquid supply pipe 28 are moved upward from their positions illustrated in FIG. 5 and the shutter 94 arranged at the opening 94a of the chamber 20 is retracted from the opening 94a so as to open the opening 94a. Then, the wafer W is carried into the chamber 20 by the carrying arm 104 from the outside of the liquid treatment apparatus 10 through the opening 94a and placed on the lift pins 23 of the lift pin plate 22. After that, the carrying arm 104 is retracted from the chamber 20. At this time, the nozzle support arms 82 are located at the retracted positions at which the nozzle support arms 82 are retracted from the chamber 20. Specifically, the nozzle support arms 82 stand by in the standby area 80. A gas such as clean air is delivered downward from the air hood 70 into the chamber 20 while the gas is discharged therefrom, whereby the atmosphere within the chamber 20 is replaced.

Next, the lift pin plate 22 and the treatment liquid supply pipe 28 are moved downward and located at the lowered positions illustrated in FIG. 5. At this time, the holding members 25 arranged on the holding plate 26 hold the wafer W placed on the lift pins 23 from the side of the wafer W, and remove the wafer W slightly from the lift pins 23.

After that or after the lift pin plate 22 moves down, the air hood 70 is moved from the lowered position to the lifted position as illustrated in FIG. 9(b). After that, the top plate 32 is moved from the retracted position to the advanced position. Thus, the wafer W held by the substrate holder 21 is covered by the top plate 32. The top plate 32 is rotated around the rotary shaft 34 in the horizontal plane by providing rotational driving force from the servo motor 36 to the top plate 32 after the top plate 32 is moved to the advanced position. After that, the cylindrical outer cup 50 is moved up from the lowered position to be positioned at the lifted position as illustrated in FIG. 9(c). Thus, a space separated from the outside is defined around the wafer W by the top plate 32 and the cylindrical outer cup 50. In the following description, the space defined inside the top plate 32 and the cylindrical outer cup 50 and separated from the outside is referred to as a "first treatment space". As described later, the first treatment space is a space in which the liquid treatment is performed to the wafer W using SPM solution obtained by mixing the sulfuric acid with the hydrogen peroxide solution. Accurate positional relationships among an upper end portion of the cylindrical outer cup 50, the top plate 32 and parts located near the cylindrical outer cup 50 and the top plate 32 during the liquid treatment are illustrated in FIG. 6B (the same applies to the states illustrated in FIGS. 9(d) to 9(f), 10(g) and 11(o)).

After the cylindrical outer cup 50 is moved to the lifted position, the first nozzle support arm 82p among the four nozzle support arms 82 standing by in the standby area 80 advances into the chamber 20 through the side opening 50m of the cylindrical outer cup 50 (refer to FIG. 9(d)). In this case, the first nozzle support arm 82p performs linear motion.

Next, the holding plate 26 and lift pin plate 22 of the substrate holder 21 are rotated. Thus, the wafer W held by the holding members 25 of the holding plate 26 rotates. While the wafer W rotates, SPM solution is supplied onto the upper surface of the wafer W from the nozzle 82a of the first nozzle support arm 82p that has advanced into the cylindrical outer cup 50. In this case, the SPM solution supplied onto the upper surface of the wafer W has a high temperature of 100° C. or higher, for example, preferably approximately 170° C. In this manner, the SPM solution is supplied onto the upper surface of the wafer W, and an SPM treatment is performed to the wafer W. In this liquid treatment, a resist that is present on the upper surface of the wafer W is peeled off by the SPM solution. The SPM solution and the peeled resist are delivered to and collected by the first discharging part 46a due to centrifugal force of the rotating wafer W. Specifically, in the SPM treatment performed to the wafer W, the guide cup 44 is located at the lowered position, and whereby the SPM solution and the peeled resist are delivered to and collected by the first discharging part 46a. In this case, the SPM solution can be supplied to the whole areas of the wafer W uniformly by moving the nozzle 82a of the first nozzle support arm 82p in a left-right direction of FIG. 9(d) while discharging the SPM solution toward the wafer W from that nozzle 82a.

Since the first treatment space is defined inside the top plate 32 and the cylindrical outer cup 50, it is possible to prevent an atmosphere within the first treatment space from flowing to the outside and prevent an atmosphere within the outside from flowing into the first treatment space in the SPM treatment performed to the wafer W. In addition, since the top plate 32 rotates in a horizontal plane, liquid droplets of the treatment liquid such as the SPM solution, which adhere to the lower surface of the top plate 32, are directed toward the peripheral edge of the top plate 32 by the centrifugal force, flow into the liquid receiving space 132 of the liquid receiving member 130 and are discharged from the liquid receiving space 132 to the factory drainage system through the discharge port 136. The discharge port 136 is connected to the discharge pipe 137c on which the separator 137a and the ejector 137b are provided. In this case, the liquid droplets of the treatment liquid scattering from the outer circumference of the wafer W are received by the outer liquid receiving space 132 and then discharged. Thus, the liquid droplets can be collected, while scattering of the liquid droplets onto the wafer W is prevented. Therefore, re-adhesion of the treatment liquid to the wafer W can be prevented. Liquid droplets of the treatment liquid, which adhere to an inner wall surface of the cylindrical outer cup 50, fall along the inner wall surface of the cylindrical outer cup 50 by their own weights. Thus, re-adhesion of liquid droplets of the treatment liquid such as the SPM solution can be suppressed.

When the SPM treatment to the wafer W is completed, the first nozzle support arm 82p that has advanced into the cylindrical outer cup 50 retracts from the chamber 20 and stands by in the standby area 80. At this time, the wafer W and the top plate 32 continuously rotate. In addition, during the movement of the first nozzle support arm 82p from the cylindrical outer cup 50 to the retracted position, the first nozzle support arm 82p is cleaned by the arm cleaning unit 88. Thus, contamination such as the SPM solution attached to the first nozzle support arm 82p can be removed by the cleaning.

Next, the third nozzle support arm 82r among the four nozzle support arms 82 standing by in the standby area 80 advances into the chamber 20 through the side opening 50m of the cylindrical outer cup 50 (refer to FIG. 9(f)). In this case, the third nozzle support arm 82r performs linear motion. While the wafer W and the top plate 32 rotate, heated deionized water (having a temperature of, for example, 80° C.) is supplied toward the center of the wafer W from the nozzle 82a of the third nozzle support arm 82r that has advanced into the cylindrical outer cup 50. At this time, heated deionized water is supplied toward the lower surface (back surface) of the wafer W from the treatment liquid supply pipe 28. In this manner, a hot rinse treatment is performed to the wafer W.

The following intermediate treatment is performed between the SPM treatment (refer to FIG. 9(d)) and the hot rinse treatment (refer to FIG. 9(f)) that are performed to the wafer W. The intermediate treatment includes a first intermediate treatment, a spin-off treatment and a second intermediate treatment. In detail, in the first intermediate treatment, a first intermediate treatment liquid that has a temperature that is lower than the temperature of the SPM solution and higher than the temperature of the rinse liquid is supplied to the front surface of the wafer W. Specifically, in connection with the first nozzle support arm 82p illustrated in FIG. 8(a), the on-off valve for the sulfuric acid supply unit 83c is opened while the on-off valve for the hydrogen peroxide solution supply unit 83b is closed, so that only the sulfuric acid heated by the heater 83d is discharged from the nozzle 82a of the first nozzle support arm 82p toward a central portion of the front surface of the wafer W for a predetermined time period. In this case, since the hydrogen peroxide solution is not supplied, a chemical reaction of the sulfuric acid with the hydrogen peroxide solution does not occur, so that the sulfuric acid having a temperature (e.g., 140° C.) that is lower than the temperature (e.g., 170° C.) of the SPM solution but not lower than the temperature (e.g., 80° C.) of the rinse liquid (deionized water) is supplied onto the front surface of the wafer W. Due to the first intermediate treatment, the temperature of the wafer W does not fall rapidly from the temperature during the SPM treatment to the temperature during the rinse treatment, but gradually falls to an intermediate temperature. As a result, it is possible to prevent the wafer W from being thermally deformed due to rapid change in the temperature of the wafer W. Thus, the wafer W can be held by the substrate holder 21 in good condition.

Next, the spin-off treatment is performed to spin off and remove the sulfuric acid from the front surface of the wafer W by rotating the wafer W. In the spin-off treatment, the wafer W is rotated for a predetermined time period at a higher speed than those in the SPM treatment and the first intermediate treatment. After that, the second intermediate treatment is performed to supply, to the back surface of the wafer W, a second intermediate treatment liquid having a temperature lower than the temperature of the first intermediate treatment liquid (sulfuric acid) but not lower than the temperature of the rinse liquid. Specifically, by supplying, from the treatment liquid supply unit 29 to the treatment liquid supply pipe 28, deionized water having a temperature (e.g., 80° C.) lower than the temperature (e.g., 140° C.) of the first intermediate treatment liquid (sulfuric acid) but not lower than the temperature (e.g., 80° C.) of the rinse liquid, the deionized water with the temperature of 80° C. is discharged onto the back surface of the wafer W from the head portion 28a of the treatment liquid supply pipe 28. Due to the second intermediate treatment, the temperature of the wafer W can be gradually reduced to a temperature of the wafer W during the rinse treatment from the back surface of the wafer W. In particular, since the deionized water is supplied onto the back surface of the wafer W, even if the first intermediate liquid (sulfuric acid) remains on the front surface of the wafer W, the occurrence of rapid chemical reaction of the first intermediate treatment liquid (sulfuric acid) with the rinse liquid (deionized water) can be suppressed. It is, therefore, possible to prevent scattering of reaction products associated with the chemical reaction, and contaminating the inside of the cylindrical outer cup 50.

As described above, since the intermediate treatment that includes the first intermediate treatment, the spin-off treatment and the second intermediate treatment is performed between the SPM treatment and the hot rinse treatment on the wafer W, it is possible to suppress the occurrence of a rapid chemical reaction of the SPM solution with the rinse liquid (deionized water) and prevent scattering of reaction products associated with the chemical reaction, and contaminating the inside of the cylindrical outer cup 50.

When the hot rinse treatment to the wafer W is completed, the third nozzle support arm 82r that has advanced into the cylindrical outer cup 50 retracts from the inside of the cylindrical outer cup 50 and stands by in the standby area 80, as illustrated in FIG. 10(g). At this time, the wafer W continuously rotates. During the movement of the third nozzle support arm 82r from the inside of the cylindrical outer cup 50 to the retracted position, the third nozzle support arm 82r is cleaned by the arm cleaning unit 88. Thus, contamination adhering to the third nozzle support arm 82r can be removed. From the time point before the third nozzle support arm 82r is retracted from the inside of the cylindrical outer cup 50, the fixed rinse nozzle 43 starts supplying deionized water (having a temperature of, for example, 80° C.) toward the center of the wafer W from. Thus, since a liquid film is formed on the front surface of the wafer W by the fixed rinse nozzle 43, the front surface of the wafer W is not exposed and it is possible to prevent adhesion of particles to the front surface of the wafer W.

Then, the cylindrical outer cup 50 is moved down from the lifted position to the lowered position as illustrated in FIG. 10(h). After that, the rotation of the top plate 32 is stopped. At this time, the fixed rinse nozzle 43 continuously supplies the deionized water (having a temperature of, for example, 80° C.) toward the center of the wafer W. When the cylindrical outer cup 50 is moved to the lowered position, the cylindrical outer cup 50 is dipped in the cleaning liquid stored in the storage portion 52a of the cleaning unit 52. Thus, the cylindrical outer cup 50 is cleaned, and it is possible to prevent liquid droplets of the treatment liquid such as the SPM solution scattered during the SPM treatment of the wafer W from remaining on the inner wall of the cylindrical outer cup 50.

After that, the top plate 32 is moved from the advanced position to the retracted position and housed in the top plate storage unit 38 as illustrated in FIG. 10(i). An atmosphere within the top plate storage unit 38 is discharged by the gas discharging unit 39. Thus, even if liquid droplets of the treatment liquid such as the SPM solution adhere to the lower surface of the top plate 32 during the SPM treatment of the wafer W, and the top plate 32 is stored in the top plate storage unit 38, an atmosphere of the treatment liquid such as the SPM solution is discharged by the gas discharging unit 39. The atmosphere of the SPM solution, therefore, does not flow into the standby area 80 and the chamber 20.

Then, the cylindrical outer cup 50 cleaned by the cleaning unit 52 is moved up from the lowered position to locate it at the lifted position as illustrated in FIG. 10(j). At this time, the fixed rinse nozzle 43 continuously supplies the deionized water (having a temperature of, for example, 80° C.) toward the center of the wafer W. After that, the air hood 70 is moved down from the lifted position to locate it at the lowered position as illustrated in FIG. 10(k). Specifically, the upper end of the cylindrical outer cup 50 contacts or becomes close to a lower surface of the lower plate 77 of the air hood 70. Thus, a space separated from the outside is defined around the wafer W by the air hood 70 and the cylindrical outer cup 50. In the following description, the space defined inside the air hood 70 and the cylindrical outer cup 50 and separated from the outside is referred to as a "second treatment space". The second treatment space is a space in which gas cleaned by the air hood 70 flows downward, as described later.

After that, the third nozzle support arm 82r among the four nozzle support arms 82 standing by in the standby area 80 advances into the chamber 20 through the side opening 50m of the cylindrical outer cup 50 (refer to FIG. 10(l)). In this case, the third nozzle support arm 82r performs linear motion. Then, while the wafer W rotates and the gas cleaned by the air hood 70 flows in the second treatment space, SC-1 liquid is supplied toward the center of the wafer W from the nozzle 82a of the third nozzle support arm 82r that has advanced into the cylindrical outer cup 50. Thus, a resist remaining on the front surface of the wafer W can be removed. During the liquid treatment performed to the wafer W using the SC-1 liquid, the guide cup 44 is positioned at the lifted position. Thus, the SC-1 liquid and the remaining resist are delivered to the second discharging part 46b to be discharged therefrom.

When the liquid treatment is performed on the wafer W using the SC-1 liquid, the second treatment space is defined inside the air hood 70 and the cylindrical outer cup 50. It is, therefore, possible to prevent an atmosphere within the second treatment space from flowing out to the outside and prevent an atmosphere within the outside from flowing into the second treatment space. In addition, since the second treatment space is a closed space, the volume of the space in which the treatment is performed is small. Thus, the efficiency of replacing the cleaned gas within the second treatment space can be improved.

When the liquid treatment on the wafer W using the SC-1 liquid is completed, the third nozzle support arm 82r that has advanced into the cylindrical outer cup 50 retracts from the inside of the cylindrical outer cup 50 and stands by in the standby area 80 as illustrated in FIG. 11(m). At this time, the wafer W continuously rotates. In addition, during the movement of the third nozzle support arm 82r from the inside of the cylindrical outer cup 50 to the retracted position, the third nozzle support arm 82r is cleaned by the arm cleaning unit 88. Thus, contamination such as the SC-1 liquid attached to the third nozzle support arm 82r can be removed. In addition, after the third nozzle support arm 82r is retracted from the inside of the cylindrical outer cup 50, the gas cleaned by the air hood 70 continues to flow in the second treatment space. After that, the third nozzle support arm 82r among the four nozzle support arms 82 standing by in the standby area 80 advances into the chamber 20 through the side opening 50m of the cylindrical outer cup 50. In this case, the third nozzle support arm 82r performs linear motion. While the wafer W and the top plate 32 rotate, room-temperature deionized water is supplied toward the center of the wafer W from the nozzle 82a of the third nozzle support arm 82r that has advanced into the cylindrical outer cup 50. At this time, room-temperature deionized water is supplied toward the lower surface (back surface) of the wafer W from the treatment liquid supply pipe 28. In this manner, the rinse treatment is performed to the wafer W. After that, the drying treatment is performed to the wafer W in the second treatment space by rotating the wafer W at a high speed.

After the liquid treatment to the wafer W using the SC-1 liquid is completed and the third nozzle support arm 82r is retracted from the inside of the cylindrical outer cup 50 and before the drying treatment is performed to the wafer W, the fourth nozzle support arm 82s may be advanced into the cylindrical outer cup 50, and the rinse treatment may be performed to the wafer W by spraying liquid droplets of deionized water onto the wafer W from the two-fluid nozzle of the fourth nozzle support arm 82s. In this case, even after the rinse treatment on the wafer W is completed and the fourth nozzle support arm 82s is retracted from the inside of the cylindrical outer cup 50, the gas cleaned by the air hood 70 continues to flow in the second treatment space. After that, the drying treatment is performed to the wafer W in the second treatment space by rotating the wafer W at a high speed.

When the drying treatment to the wafer W is completed, as illustrated in FIG. 11(*n*), the cylindrical outer cup 50 is moved down from the lifted position to locate it at the lowered position, and the side portion of the substrate holder 21 is opened. After that, the lift pin plate 22 and treatment liquid supply pipe 28 of the substrate holder 21 are moved up from their positions illustrated in FIG. 5, and the shutter 94 arranged at the opening 94*a* of the chamber 20 is retracted from the opening 94*a* to open the opening 94*a*. Then, the carrying arm 104 moves into the chamber 20 from the outside of the liquid treatment apparatus 10 through the opening 94*a*, and the wafer W located on the lift pins 23 of the lift pin plate 22 is transferred to the carrying arm 104. After that, the wafer W taken by the carrying arm 104 is carried to the outside of the liquid treatment apparatus 10. In this manner, the series of liquid treatments to the wafer W are completed.

Next, a cleaning treatment of the top plate 32 is described with reference to FIG. 11(*o*). In order to clean the top plate 32, the air hood 70 is moved from the lowered position to the lifted position. After that, the top plate 32 is moved from the retracted position to the advanced position. In addition, after the top plate 32 is moved to the advanced position, the top plate 32 is rotated around the rotary shaft 34 in a horizontal plane by giving rotational driving force to the top plate 32 from the servo motor 36. After that, the cylindrical outer cup 50 is moved up from the lowered position to locate it at the lifted position.

After the cylindrical outer cup 50 is moved to the lifted position, the second nozzle support arm 82*q* among the four nozzle support arms 82 standing by in the standby area 80 advances into the chamber 20 through the side opening 50*m* of the cylindrical outer cup 50. In this case, the second nozzle support arm 82*q* performs linear motion.

After that, the top plate cleaning liquid such as deionized water is discharged toward the top plate 32 from the nozzle 82*a* of the second nozzle support arm 82*q* that has advanced into the cylindrical outer cup 50. Thus, the SPM solution or the like adhering to the top plate 32 is removed. The whole areas of the top plate 32 are uniformly cleaned by moving the nozzle 82*a* of the second nozzle support arm 82*q* in a left-right direction of FIG. 11(*o*) while discharging the top plate cleaning liquid such as deionized water toward the top plate 32 from the nozzle 82*a*. Since the closed space is formed inside the top plate 32 and the cylindrical outer cup 50 when the cleaning treatment of the top plate 32 is performed, it is possible to prevent the top plate cleaning liquid discharged from the nozzle 82*a* of the second nozzle support arm 82*q* from flowing out of the cylindrical outer cup 50. In the cleaning treatment of the top plate 32, the cleaning liquid adhering to the lower surface of the top plate 32 is directed toward the peripheral edge of the top plate 32 by the centrifugal force, flows into the liquid receiving space 132 of the liquid receiving member 130, and then discharged to the factory drainage system from the liquid receiving space 132 through the discharge port 136 and the discharge pipe 137*c* on which the mist separator 137*a* and the ejector 137*b* are installed, in the same manner as that in the SPM treatment performed to the wafer W. Liquid droplets of the cleaning liquid, which adhere to the inner wall surface of the cylindrical outer cup 50, fall along the inner wall surface of the cylindrical outer cup 50 by their own weights.

The aforementioned cleaning treatment of the top plate 32 may be performed every time after the resist film removing treatment and the cleaning treatment of the wafer W are completed, or may be performed periodically. The cleaning treatment of the top plate 32 can be performed in parallel with the hot rinse treatment (illustrated in FIG. 9(*f*)) performed to the wafer W. If the cleaning treatment of the top plate 32 and the hot rinse treatment are simultaneously performed, the second nozzle support arm 82*q* and the third nozzle support arm 82*r* simultaneously advance into the cylindrical outer cup 50. In this case, the vertical position of the second nozzle support arm 82*q* is higher than the third nozzle support arm 82*r*. Thus, when the second nozzle support arm 82*q* and the third nozzle support arm 82*r* simultaneously advance into the cylindrical outer cup 50, the second nozzle support arm 82*q* and the third nozzle support arm 82*r* do not collide or interfere with each other. Thus, the process of supplying the top plate cleaning liquid such as deionized water to the top plate 32 from the nozzle 82*a* of the second nozzle support arm 82*q*, and the process of supplying the heated deionized water to the wafer W from the nozzle 82*a* of the third nozzle support arm 82*r*, can be performed simultaneously.

In the aforementioned embodiment, the top plate 32 is provided with the top plate rotating mechanism (specifically, the rotary shaft 34, the timing belt 36*a*, the servo motor 36, etc) for rotating the top plate 32 in a horizontal plane, and the liquid receiving member 130 is arranged close to the peripheral edge of the top plate 32 outside the peripheral edge. Thus, by rotating the top plate 32 in a horizontal plane by the top plate rotating mechanism during the SPM treatment performed to the wafer W, the SPM solution adhering to the lower surface of the top plate 32 flows to the peripheral edge of the top plate 32 due to the centrifugal force and then captured by the liquid receiving space 132. It is, therefore, possible to suppress re-adhesion of the SPM solution to the wafer W. Since the liquid receiving space 132 is suctioned, the SPM solution temporarily stored in the liquid receiving space 132 does not scatter toward the wafer W, or radially outside the top plate 32, or toward the space above the top plate 32. In addition, since the gap between the peripheral edge of the top plate 32 and the liquid receiving member 130 is relatively small, it is not necessary to strongly suction the liquid receiving space 132.

When the cylindrical outer cup 50 is located at the lifted position and the top plate 32 is located at the advanced position, the space for the SPM treatment of the wafer W is defined in the cylindrical outer cup 50. Since the closed space is defined inside the top plate 32 and the cylindrical outer cup 50 during the SPM treatment of the wafer W, it is possible to prevent an atmosphere within the space from flowing out of the space to the outside and prevent an atmosphere within the outside from flowing into the space.

In the liquid treatment apparatus 10 according to the present embodiment, the treatment liquid to be supplied by the nozzle 82*a* of the first nozzle support arm 82*p* is a liquid (SPM solution) obtained by mixing the sulfuric acid with the hydrogen peroxide solution. The high-temperature treatment liquid (SPM solution) is supplied by the nozzle 82*a* of the first nozzle support arm 82*p* to the wafer W held by the substrate holder 21. After the high-temperature treatment liquid is supplied and the air hood 70 is moved to the lowered position, the additional liquid treatment is performed on the wafer W using the other treatment liquid that has a lower temperature than the high-temperature treatment liquid (SPM solution) while the gas cleaned by the air hood 70 flows downward. Specifically, the other treatment liquid that has the lower temperature than the high-temperature treatment liquid (SPM solution) is the mixed liquid (SC-1 liquid) containing the ammonia water and the hydrogen peroxide solution. In the present embodiment, the high-temperature treatment liquid is not limited to the SPM solution. Other chemical liquids may be used as the high-temperature treatment liquid as long as a fume is generated from the treatment liquid. As the other chemical liquids, a mixed liquid containing a sulfuric acid and a nitric acid, a mixed liquid containing a sulfuric acid and a buffered hydrofluoric acid (BHF), and a mixed liquid containing a sulfuric acid and a diluted buffered hydrofluoric acid (BHF) may be used.

The liquid treatment apparatus in the present embodiment is not limited to the aforementioned type, and various modifications are possible.

The flow rectifying plate 140 arranged above the top plate 32 has an effect of rectifying gas, which flows from a space above the top plate 32 into the liquid receiving space 132 of the liquid receiving member 130, to be uniformly distributed in the circumferential direction. It is, therefore, preferable that the flow rectifying plate 140 be arranged, as in the foregoing embodiment. Even if the flow rectifying plate 140 is not arranged, and the liquid receiving space 132 is suctioned, at least airflow flowing from the space near the peripheral edge of the upper surface of the top plate 32 into the liquid receiving space 132 is generated. Thus, the flow rectifying plate 140 may be omitted.

In the aforementioned embodiment, the discharge pipe 137c on which the mist separator 137a and the ejector 137b are installed is connected to the discharge port 136, and liquids and gases that are discharged from the liquid receiving space 132 pass through the common path. However, the configuration is not limited thereto. A discharge path for drainage and a discharge path for exhaust gas may be separately provided. In this case, the discharge path for drainage may be formed so as to extend downward from a lower portion of a wall surface surrounding the liquid receiving space 132 to discharge the drainage by gravity.

The liquid receiving space 132 is preferably suctioned, but may not be suctioned. Specifically, it is sufficient if a liquid within the liquid receiving space 132 is discharged by gravity.

In the aforementioned embodiment, the top plate 32 is rotatably, and the liquid receiving member 130 and the flow rectifying plate 140 are non-rotatably, attached to the top plate holding arm 35. However, the configuration is not limited thereto. At least one of the liquid receiving member 130 and the flow rectifying plate 140 may be rotatable. For example, the flow rectifying plate 140 may be rotatable.

In the aforementioned embodiment, the liquid receiving member 130 and the top plate 32 are fixed to the top holding arm 35 serving as a common holding member and move together, but the configuration is not limited to thereto. The liquid receiving member 130 and the top plate 32 may move separately from each other.

In the aforementioned embodiment, the upper end of the cylindrical outer cup 50 is located at a level of the lower end of the liquid receiving member 130, and the liquid receiving member 130 is not rotatable, but the configuration is not limited thereto. For example, as illustrated in FIG. 12, a liquid receiving member 130A may be coupled to a peripheral edge portion of the top plate 32, and the cylindrical outer cup 50 may surround an outer circumference of the liquid receiving member 130A. In this case, a liquid scattered from the top plate 32 and captured in a liquid receiving space 132A of the liquid receiving member 130A moves within the liquid receiving space 132A radially outwardly by centrifugal force, and is discharged from a discharge port 136A toward an inner circumferential surface of the cylindrical outer cup 50. Specifically, the cylindrical outer cup 50 that is located at the position (lifted position) surrounding the liquid receiving member 130A also has a function as a second liquid receiving cup. The flow velocity of a discharged liquid can be reduced, since the liquid is once received by the liquid receiving space 132A and then is discharged therefrom. Thus, it is possible to prevent the liquid from bouncing off the inner circumferential surface of the cylindrical outer cup 50 to scatter. In addition, if an ejection angle (angle of an axis of the discharge port 136A) of a liquid ejected from the discharge port 136A is set so that an incident angle of the liquid to the inner circumferential surface of the cylindrical outer cup 50 is small (preferably in a range of approximately 5° to 30°), it is possible to more reliably prevent the liquid discharged toward the inner circumferential surface of the cylindrical outer cup 50 from bouncing off the inner circumferential surface of the cylindrical outer cup 50 to scatter. In this manner, since the liquid is once received by the liquid receiving spaces (132, 132A), it is possible to prevent bouncing and scattering of the liquid, and re-adhesion of the liquid onto the wafer W or the substrate holder 21.

The invention claimed is:

1. A liquid treatment apparatus comprising:
   a substrate holder that holds a substrate horizontally and rotates the substrate;
   a treatment liquid nozzle that supplies a treatment liquid to the substrate held by the substrate holder;
   a liquid receiving cup that is arranged outside a peripheral edge of the substrate held by the substrate holder and receives the treatment liquid which has been supplied to the substrate by the treatment liquid nozzle;
   a top plate that covers, from above, the substrate held by the substrate holder;
   a top plate rotation driving mechanism that rotates the top plate; and
   a liquid receiving member that surrounds a peripheral edge of the top plate and has a circular liquid receiving space,
   wherein the circular liquid receiving space has at an inner circumference thereof an opening that opens toward a peripheral edge of the top plate to receive a liquid scattering from the top plate, wherein the liquid receiving member has a bottom and a rim member extending upwardly from the bottom to define the liquid receiving space together with the bottom, and forming an inner peripheral edge of the liquid receiving space, wherein the peripheral edge of the top plate is located radially outside of the rim member, and
   wherein the rim member extends circumferentially along the peripheral edge of the top plate.

2. The liquid treatment apparatus according to claim 1, further comprising at least one discharge pipe connected to the liquid receiving space to discharge a fluid within the liquid receiving space.

3. The liquid treatment apparatus according to claim 2, wherein a suctioning mechanism is connected to the discharge pipe.

4. The liquid treatment apparatus according to claim 3, further comprising a flow rectifying plate arranged above the top plate, wherein the suctioning mechanism suctions a space located between the top plate and the flow rectifying plate through the liquid receiving space.

5. The liquid treatment apparatus according claim 1, further comprising:
   a holding member that holds the top plate; and a holding member moving mechanism that moves the holding member, wherein the liquid receiving member is held by the holding member.

6. The liquid treatment apparatus according to claim 5, wherein the liquid receiving member is non-rotatably fixed to the holding member.

7. The liquid treatment apparatus according to claim 1, further comprising a top plate cleaning nozzle that supplies a cleaning liquid to a lower surface of the top plate.

8. The liquid treatment apparatus according to claim 1, further comprising a cylindrical outer cup arranged around the liquid receiving cup and having an upper opening at an upper portion thereof, the cylindrical outer cup being capable of moving up and down between a lifted position at which an upper end of the cylindrical outer cup is located above the liquid receiving cup and a lowered position located under the lifted position, wherein a closed space surrounded by the cylindrical outer cup and the top plate is defined when the liquid receiving member comes close to or into contact with the upper end of the cylindrical outer cup.

9. The liquid treatment apparatus according to claim 1, wherein the liquid receiving member is coupled to the top plate.

10. The liquid treatment apparatus according to claim 9, wherein the liquid receiving member has a discharge port.

11. The liquid treatment apparatus according to claim 10, further comprising a second liquid receiving cup arranged around an outer circumference of the discharge port.

12. The liquid treatment apparatus according to claim 11, further comprising a cup driving mechanism that moves the second liquid receiving cup between a position at which the second liquid receiving cup surrounds the liquid receiving member and a position at which the second liquid receiving cup does not surround the liquid receiving member.

13. The liquid treatment apparatus according to claim 9, further comprising a top plate cleaning nozzle that supplies a cleaning liquid to a lower surface of the top plate.

\* \* \* \* \*